United States Patent
Yen et al.

[19]

[11] Patent Number: 6,117,362
[45] Date of Patent: Sep. 12, 2000

[54] LONG-PERSISTENCE BLUE PHOSPHORS

[75] Inventors: William M. Yen, Athens, Ga.; Weiyi Jia, Mayaquez, Puerto Rico; Lizhu Lu; Huabiao Yuan, both of Athens, Ga.

[73] Assignees: University of Georgia Research Foundation, Inc., Atlanta, Ga.; University of Puerto Rico, San Juan, Puerto Rico

[21] Appl. No.: 09/187,944

[22] Filed: Nov. 6, 1998

Related U.S. Application Data

[60] Provisional application No. 60/064,690, Nov. 7, 1997, and provisional application No. 60/064,691, Nov. 7, 1997.

[51] Int. Cl.$^7$ .............................. C09K 11/55; C09K 11/64
[52] U.S. Cl. .................................. 252/301.4 R; 117/950; 117/946
[58] Field of Search ...................... 252/301.4 R; 117/946, 117/950

[56] References Cited

U.S. PATENT DOCUMENTS

| | | | |
|---|---|---|---|
| 3,294,699 | 12/1966 | Lange | 252/301.4 R |
| 4,110,660 | 8/1978 | Wolfe | 313/486 |
| 4,249,108 | 2/1981 | Wolfe | 313/486 |
| 4,623,816 | 11/1986 | Hoffman et al. | 313/487 |
| 4,733,126 | 3/1988 | Yamakawa et al. | 313/487 |
| 5,350,971 | 9/1994 | Jeong | 313/487 |
| 5,358,734 | 10/1994 | Lenox et al. | 427/71 |
| 5,376,303 | 12/1994 | Royce et al. | 252/301.4 R |
| 5,424,006 | 6/1995 | Murayama et al. | 252/301.4 R |

FOREIGN PATENT DOCUMENTS

| | | |
|---|---|---|
| 0 241 848 | 3/1990 | European Pat. Off. . |
| 0 418 902 A2 | 3/1991 | European Pat. Off. . |
| 710709 A1 | 6/1996 | European Pat. Off. . |
| 765925 A1 | 4/1997 | European Pat. Off. . |
| 51-031037 | 9/1976 | Japan . |
| 82017034 | 8/1982 | Japan . |
| 5078659 | 3/1993 | Japan . |
| 94029416 | 4/1994 | Japan . |
| 94029417 | 4/1994 | Japan . |

OTHER PUBLICATIONS

Abbruscato et al. (1971), "Optical and Electrical Properties of SrAl$_2$O$_4$:Eu$^{2+}$" J. Electrochem. Soc. 118(6):930–933.

Autrata, R. et al. (1983), "Single–Crystal Aluminates—A New Generation of Scintillators for Scanning Electron Microscopes and Transparent Screens in Electron Optical Devices," Scanning Electron. Microsc., pp. 489–500.

Babitskaya, R.A. et al. (1981), "Improvement and development of new effective luminophors having green and blue luminescence for gas discharge indicator panels," Chemical Abstracts 96:112888j (1982).

Chen, R. and McKeever, S.W.S. (1997), Theory of Thermoluminescence and Related Phenomena, World Scientific, Singapore, pp. 1–81.

Chemekova et al. (1977) Terzisy Dokl. Uses. Soveshch. Rostu. Krist. 5$^{th}$ 2:184–185 (Chem. Abst. (1980) 93:85423h).

Czochralski, J. (1918), "Ein neues Verfahren zur Messung der Kristallisationsgeschwindigkeit der Metalle," Z. Phys. Chem. 92:219–221.

(List continued on next page.)

Primary Examiner—C. Melissa Koslow
Attorney, Agent, or Firm—Greenlee, Winner and Sullivan, P.C.

[57] ABSTRACT

This invention relates to phosphors including long-persistence blue phosphors. Phosphors of the invention are represented by the general formula:

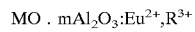

MO . mAl$_2$O$_3$:Eu$^{2+}$,R$^{3+}$ wherein m is a number ranging from about 1.6 to about 2.2, M is Sr or a combination of Sr with Ca and Ba or both, R$^{3+}$ is a trivalent metal ion or trivalent Bi or a mixture of these trivalent ions, Eu$^{2+}$ is present at a level up to about 5 mol % of M, and R$^{3+}$ is present at a level up to about 5 mol % of M. Phosphors of this invention include powders, ceramics, single crystals and single crystal fibers. A method of manufacturing improved phosphors and a method of manufacturing single crystal phosphors are also provided.

30 Claims, 16 Drawing Sheets

OTHER PUBLICATIONS

Jia, W. (1998), "Phosphorescent dynamics in $SrAi_2O_4:Eu^{2+}$, $Dy^{3+}$ single crystal fibers," J. Luminescence 76 & 77:424–428.

Katsumata, T. et al. (1998), "Growth and characteristics of long persistent $SrAl_2O_4-$ and $CaAl_2O_4$–based phosphor crystals by a floating zone technique," J. Cryst. Growth 183:361–365.

Katsumata, T. et al. (1998), "Characteristics of Strontium Aluminate Crystals Used for Long–Duration Phosphors," J. Am. Ceram. Soc. 81:413–416.

Katsumata, T. et al. (1997), "Effects of Composition on the Long Phosphorescent $SrAl_2O_4:Eu^{2+}$, $Dy^{3+}$ Phosphor Crystals," J. Electrochem. Soc. 144(9):L243–L245.

Kutty, T.R. et al. (1990), "Luminescence of the $Eu^{2+}$ in Strontium Aluminates Prepared by the Hydrothermal Method," Mater. Res. Bull. 25:1355–1362.

Matsuzawa, T. et al. (1996), "A New Long Phosphorescent Phosphor with High Brightness, $SrAl_2O_4:Eu^{2+},Dy^{3+}$," J. Electrochem. Soc. 143(8):2670.

Ondracek, J. and Bohumil, H. (1991), "Some findings on blue–emitting luminophore based on (barium, europium (2+)) magnesium aluminate," Chemical Abstracts 116:161516b (1992).

Palilla, F.C. et al. (1968), "Fluorescent Properties of Alkaline Earth Aluminates of the Type $MAl_2O_4$ Activated by Divalent Europium," J. Electrochem. Soc. 115(6):642–644.

Pfann, W.G. (1952), "Principles of Zone–Melting," Trans. AIME 194:747–753.

Shinoya, S. (1998) in *Phosphor Handbook*, Shinoya, S. and Yen, W.M. (eds.), CRC Press, Inc., Boca Raton, New York, p. 3.

Smets, B. et al. (1989), "$2SrO·3Al_2O_3:Eu^{2+}$ and $1.29(Ba, Ca)O,6Al_2O_3:Eu^{2+}$. Two New Blue–Emitting Phosphors," J. Electrochem. Soc. 136(7):2119–2123.

Sonoda, M. et al. (1983), "Computed Radiography Utilizing Scanning Laser Stimulated Luminescence," Radiology 148:833–838.

Tissue, B.M. et al. (1991), "Laser–heated pedestal growth of laser and IR–upconverting materials," J. Cryst. Growth 109:323–328.

Yen, W.M. (1995) "Preparation of single crystal fibers," in *Insulating Materials for Optoelectronics*, F. Agullo–Lopez, ed., World Scientific, Singapore, Chapter 2, p. 77.

Zlotnikova et al. (1990) Ukr. Khim Zh. (Russ. Ed.) 56(11):1148–1151 (Chem. Abst. (1991)115:37798k).

Zorencko, Yu. V. et al. (1991), "The Peculiarities of Receiving of Thin Film Single Crystal Oxide Luminophores," Cryst. Properties and Preparation 36–38:226–233.

LONG-PERSISTENCE BLUE PHOSPHORS

CROSS-REFERENCE TO RELATED APPLICATIONS

This application takes priority under 35 U.S.C. §119(e) from U.S. provisional applications Ser. No. 60/064,690, filed Nov. 7, 1997 and Ser. No. 60/064,691, filed Nov. 7, 1997, both of which are incorporated by reference herein to the extent not inconsistent herewith.

This invention was made at least in part with U.S. government funding through NASA grant MURC-NCCW-0088 and NCC5–252, ARO DAAH04–96–10416 and DOE DE-FG02–94ER75764. The United States government has certain rights in this invention.

FIELD OF THE INVENTION

This invention is generally related to phosphors and more particularly is related to long-persistence blue phosphors. The invention is also directed to methods for making phosphors in powder and ceramic form as well as single crystal phosphors. The invention is further directed to articles of manufacture comprising the phosphors of this invention.

BACKGROUND OF THE INVENTION

Persistent phosphorescing materials, such as ZnS:Cu,Co, ZnCdS:Cu and CaSrS:Bi, have been used for many years. Recently a much brighter and longer persistent green phosphor, $SrAl_2O_4:Eu^{2+}:Dy^{3+}$ has been produced.

Strong green luminescence from $Eu^{2+}$-doped $SrAl_2O_4$ was reported by H. Lange in Belgian patent 1,347,45 and U.S. Pat. No. 3,294,696. Efficient luminescence in the spectral range 450–520 nm was also reported from $Eu^{2+}$-doped $CaAl_2O_4$, $MgAl_2O_4$, $BaAl_2O_4$, and $SrAl_2O_4$ and their counterparts using alkaline earth cationic combinations. (F. C. Palilla, A. K. Levine and M. R. Tomkus (1968) J. Electrochem. Soc. 115:642).

Long lasting and more efficient phosphorescence has obtained in $Eu^{2+}$ doped $SrAl_2O_4$ synthesized with excess alumina which results in formation of trapping centers associated with the $Sr^{+2}$ vacancy (Abbruscato et al. (1971) J. Electrochem. Soc. 118:930).

Improved long persistence phosphors of certain alkaline earth aluminates were reported by T. Matsuzawa, Y. Aoki, N. Takeuchi and Y. Murayama (1996) J. Electrochem. Soc. 143(8):2670, and in U.S. Pat. No. 5,424,006. The brightness and persistence time of $SrAl_2O_4:Eu^{2+}$ was improved by co-doping various trivalent rare earth ions to produce appropriate trapping centers. The best result was obtained by co-doping $Dy^{+3}$ with $Eu^{+2}$ into $SrAl_2O_4$ and $Nd^{3+}$ with $Eu^{2+}$ into $CaAl_2O_4$ to get long persistent green and purple emission, respectively. U.S. Pat. No. 5,424,006 also reports phosphors in which $Mg^{2+}$ is substituted for $Sr^{2+}$ in $SrAl_2O_4:Eu^{2+}$, $Dy^{3+}$.

EP published application 765,925 (Moriyama et al.) reports $Eu^{2+}$-activated strontium aluminate phosphors in which part of the $Sr^{2+}$ of the host is replaced with $Pb^{3+}$, $Dy^{3+}$ or $Zn^{2+}$. The zinc-doped materials are reported to display enhanced brightness and persistence compared to $SrAl_2O_4:Eu^{2+}$, $Dy^{3+}$.

EP published application 710,709 (Murayama et al.) reports phosphors of matrix $M_1-xAl_2O_{4-x}$ Where M is at least one metal selected from calcium, strontium, barium and, optionally, magnesium, and x is a number not equal to 0. The matrix comprises europium as an activator and a co-activator elected from a rare earth metal, manganese, tin or bismuth.

JP Patent 76031037 (1976, Tokyo Shibaura Electric Co.) reports blue-emitting phosphors containing barium (or calcium or strontium)-potassium (or sodium) aluminates activated with europium and manganese.

JP Patent 94029417 (1994, Matsushita Electronics) reports a strontium aluminate phosphor activated with europium modified by incorporation of yttrium oxide.

JP Patent 94029416 (1994, Matsushita Electronics) reports a europium activated barium aluminate phosphor containing yttrium oxide to enhance phosphorescence.

Zlotnikova et al. (1990) Ukr. Khim Zh. (Russ. Ed.) 56(11):1148–1151 (Chem. Abst. (1991) 115:37798k) reports composition dependence of catho-luminescent properties of a Dy-doped $SrAl_2O_4$—$Sr Al_4O_7$ system.

T. R. Kutty et al. (1990) Mater. Res. Bull. 25:1355–1362 reports luminescence of $Eu^{2+}$, in strontium aluminates prepared by the hydrothermal method. Blue to green luminescent phosphors of general formula $Sr_nAl_2O_{3+n}$ where $n \leq 1$ are reported. The reference also reports the preparation of certain aluminoborates.

B. Smets et al. (1989) J. Electrochem. Soc. 136(7):2119–2123 reports blue-emitting phosphors: 2SrO . $3Al_2O_3:Eu^{2+}$ and 1.29 (Ba, Ca)O, 6 $Al_2O_3:Eu^{2+}$. In the background section of the reference the authors refer to an earlier report of blue-green emitting phosphors 4SrO . $7Al_2O_3:Eu^{2+}$ and BaO . $4Al_2O_3:Eu^{2+}$, which could be synthesized only in the presence of small amounts of $B_2O_3$.

Chemekova et al. (1977) Terzisy Dokl. Uses. Soveshch. Rostu. Krist. 5th 2:184–185 (Chem. Abst. (1980) 93:85423h) reports synthesis of single crystals in the calcium oxide-alumina system. Addition of europium is said to produce phosphors.

SUMMARY OF THE INVENTION

This invention relates to long-persistent phosphors of general formula:

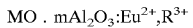

$$MO \cdot mAl_2O_3:Eu^{2+},R^{3+} \qquad 1$$

where M is Sr or a combination of Sr with Ca and/or Ba; $R^{3+}$ is a trivalent rare earth metal ion or $Bi^{3+}$, or mixtures of these trivalent metal ions; and m is a number ranging from about 1.6 to about 2.2. The phosphors are prepared using a flux, particularly $B_2O_3$. The preferred phosphor formula of this invention indicating the presence of $B_2O_3$ flux is:

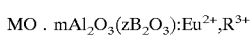

$$MO \cdot mAl_2O_3(zB_2O_3):Eu^{2+},R^{3+} \qquad 2$$

where M, m and $R^{3+}$ are as defined in formula 1 and z is a number ranging from about 0.02 to about 0.2.

The phosphors of this invention comprise an alkaline earth aluminate matrix activated with $Eu^{2+}$ and doped with certain trivalent metal ions $R^{3+}$. The phosphors are activated with about 0.02 mol % to about 10 mol % (preferably about 0.2 mol % to about 1.0 mol %) of $Eu^{2+}$, activator and co-doped with about 0.02 mol % to about 20 mol % (preferably about 0.2 mo. % to about 2 mol %) to of at least one trivalent rare earth metal ion or $Bi^{3+}$. The activator and dopant concentration are measured in terms of mol % relative to the alkaline earth metal element, M.

Preferred phosphors of this invention are blue with a phosphorescent band at about 488 nm. Phosphors of this invention have significantly improved brightness compared to sulfide phosphors, such as CaSrS:Bi. Phosphors of this invention can have persistence times up to about 18 hr.

The phosphors of this invention are chemically stable, resistant to moisture and UV radiation and are believed to be relatively harmless to the environment.

Preferred phosphors of this invention are those in which M is Sr.

Phosphors of this invention are activated with $Eu^{2+}$ and are codoped with a trivalent rare earth metal ion or $Bi^{3+}$. The phosphors may be codoped with a single ion or a combination of such ions selected from the group of rare earth metal ions: $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, and $Yb^{3+}$ and the Group VA metal ion $Bi^{3+}$. Preferred trivalent dopants are $Pr^{3+}$, $Ho^{3+}$, $Dy^{3+}$, and $Nd^{3+}$. Co-doping of $Dy^{3+}$ or $Y^{3+}$ with another trivalent metal ion results in phosphor of improved brightness, e.g. $MAl_4O_7$:$Eu^{2+}$, $Pr^{3+}$, $Dy^{3+}$ or $MAl_4O_7$:$Eu^{2+}$, $Ho^{3+}$, $Dy^{3+}$.

Preferred phosphors are those with m ranging from about 1.70 to about 2.05 and, more preferred, are those where m=1.75, the host material being $M_4Al_{14}O_{25}$ and m=2, the host material being $MAl_4O_7$. More preferred are phosphors where M=Sr and m=1.75 or m=2.

Phosphors of this invention also include those in which $Mg^{2+}$ or $Zn^{2+}$, or a mixture of both, is substituted for $Al^{3+}$ in the matrix material and where $M^{2+}$, particularly $Sr^{2+}$, are replaced with an alkali metal (e.g., $Na^+$ or $K^+$) ion in the matrix. These substitutions are believed to effect charge compensation.

The phosphors of this invention can be prepared in powder form or as a ceramic. Phosphor materials of this invention can also be grown as single crystals which display desirable phosphorescence properties, including long-persistence.

The phosphors of this invention can be used in a variety of applications, e.g., in luminous paints, luminous plastics and for night vision devices and manufactures. The phosphors in ceramic form can be used for manufacture of phosphorescent jewelry and other ornaments or apparel. The phosphors may also be used in manufacture of infrared laser beam sensors.

DETAILED DESCRIPTION OF THE INVENTION

Figure 1:
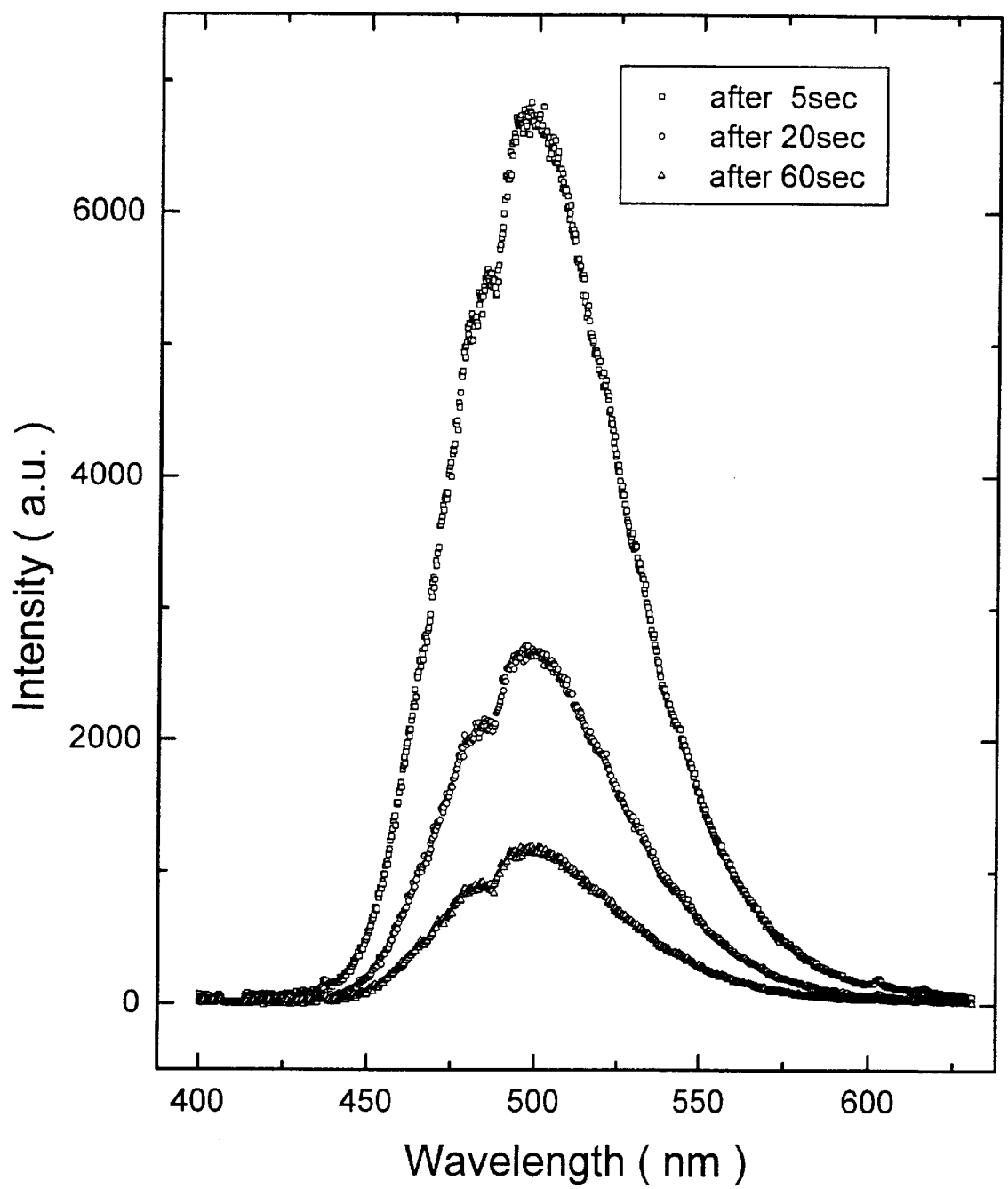
FIG. 1 is a spectrum of the after-glow of a pelleted sample of $SrAl_4O_7(0.1B_2O_3)$:$0.01Eu^{2+}$,$0.02Pr^{3+}$ measured at varying time (5–60 sec) after exposure of the sample to a 4 W UV lamp for two minutes.

This invention relates to long-persistence blue phosphors. Phosphors of this invention are based on doping of an activator (an emitter) into a host matrix. Several basic physical factors should be considered in developing such phosphors. The host (or matrix) and activator are selected to provide the desired emission color (dependent upon the wavelength of emission) and high quantum efficiency. The energy of the localized ground state of the activator should be well above the valence band of the host to allow persistent phosphorescence to occur.

Persistent phosphorescence was discovered in the $11^{th}$ century in China and Japan and in the $16^{th}$ century in Europe (Shionoya, S. (1998) in Phosphor Handbook, Shionoya, S. and Yen, W. M. (eds.), CRC Press, Inc., Boca Raton, N.Y., p. 3). The phenomenon involves two kinds of active centers: emitters and traps. The phosphorescent dynamics are complex and many aspects remain unclear. Thermoluminescence and photostimulable phosphorescence are physically governed by mechanisms similar to persistent phosphorescence Chen, R and McKeever, S. W. S. (1997), Theory of Thermoluminescence and Related Phenomena, World Scientific, Singapore; Sonoda, M. et al. (1983) Radiology 148:833). The main difference between these three phenomena appears to be the depth of traps. When a phosphor possesses centers with certain trapping depth which can be effectively activated at room temperature, it will show persistent phosphorescence. Deeper trapping centers can be activated by heating or photostimulation. Therefore, a study of phosphorescence dynamics allows the characterization of these three important luminescence processes. Single crystal phosphors facilitate studies of phosphorescence dynamics.

The traditional persistent phosphors are sulfides, ZnS, CdS, CaS and SrS, and their mixed crystals. All of these compounds have high vapor pressure, and it has generally been difficult to grow crystals from the melt.

Methods described herein allow the preparation of phosphorescent single crystals. Single crystals are readily disntinguishable by appearance from polycrystalline materials and from grained crystals. Polycrystals or grained crystals are opaque and exhibit grain boundaries, because the grains are small (one the order of tens of micrometers). Large grained crystals have the appearance of broken glass, the grains are not crystallographically oriented and as a result light traversing grained crystals will be scattered and refracted limiting transparence. In contrast, single crystals are clear and transparent without grain boundaries.

Phosphor materials of this invention can exhibit enhanced phosphorescence intensity and/or long persistence of phosphorescence. Preferred phosphors of this invention have intensity enhanced (as measured in a similar measurement system) compared to a standard commercial sample of ZnS phosphor. Persistence of phosphorescence is measured herein as persistence time which is the time after discontinuing irradiation that it takes for phosphorescence of a sample to decrease to the threshold of eye sensitivity. This threshold is the signal level of emission intensity that a naked (i.e., unaided) eye can clearly see in the dark. Persistence times are assessed by following phosphorescence intensity as a function of time. Clearly measurement comparisons of persistence times must be performed under identical conditions using the same detection systems. The term "persistent phosphors" has been applied to materials exhibiting phosphorescence lasting form minutes to hours. The term "long-persistent phosphor" historically has been used to refer to ZnS:Cu, CaS:Eu, Tm and similar materials which have a persistence time of 20 to 40 minutes. Materials herein can exhibit persistence time up to about 16–18 hrs or more. It is generally the case that phosphors having longer persistence times are more preferred. Preferred phosphor materials, including single crystals and single crystal fibers, of this invention can exhibt phosphorescence persistence times of greater than about 3–5 hrs. More preferred phosphors exhibit persistence times greater than about 10–12 hrs. Most preferred phosphors exhibt persistence times of greater than about 15–18 hrs.

Persistence times of ceramics can be longer or shorter than those of single crystals of the same materials.

The hosts of this invention are alkaline earth aluminates $MO \cdot mAl_2O_3$ (where M is an alkaline earth or mixture of alkaline earths, e.g., Sr, Ca and/or Ba) with a certain range of ratios of Al/M defined by m. The activator employed in the phosphors of this invention is $Eu^{2+}$. Hosts in which m=about 1.6 to about 2.2 provide the desired blue color and good phosphorescence brightness in combination with the Eu activator. Hosts where m=about 1.70 to about 2.05 are preferred, with those where m=1.75 or m=2.0 being more preferred. Hosts where M is Sr and m is either 1.75 ($Sr_4Al_{14}O_{25}$) or m is 2 ($SrAl_4O_7$) are preferred for use in blue phosphors of this invention.

Although not wishing to be bound by any particular theory, it is believed that long persistence time in the activated matrix phosphors of this invention is obtained by creating proper trapping centers in the matrix. Such trapping centers can store excitation energy and release it gradually to the emitter.

This invention demonstrates that doping of trivalent metal ions, particularly trivalent rare earth metal ions, into the host matrix of this invention results in phosphors having improved phosphorescence brightness and persistence time. Dopants for creating trapping centers include trivalent rare earth metal ions: $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, and $Yb^{3+}$ and trivalent $Bi^{3+}$. Preferred for the hosts of this invention is doping with trivalent Pr, Ho, Nd or Dy, with trivalent Pr and Ho being generally more preferred dopants.

This invention demonstrates for the host matrices of this invention that co-doping of trivalent Dy or Y along with another trivalent rare earth metal ion results in phosphors improved over those doped with a single trivalent rare earth metal ion. Preferred combinations of trivalent rare earth metal ions are Dy with Pr or Ho and Y with Pr or Ho.

Phosphors of this invention also include those in which a portion of $Al^{3+}$ in the host is replaced with a divalent ion, such as $Mg^{2+}$ or $Zn^{2+}$ (alone or in combination) and those in which a portion of the alkaline earth metal ion ($M^{2+}$) is replaced with a monovalent alkali metal ion, such as $Na^+$ or $K^+$ (alone or in combination). The doping level is designed to compensate the charge defects which are induced due to substitution of $Sr^{2+}$ by $R^{3+}$.

This invention specifically exemplifies phosphors in powder or ceramic form prepared by combining the host, activator and trivalent metal ion dopants with a flux material. The flux material of most interest is $B_2O_3$. The properties of the powder and ceramic phosphors of this invention are significantly affected by the use of the flux material during preparation. Both the presence or absence of the flux and the amount of flux employed can affect phosphor properties. It has been demonstrated with the hosts of this invention that varying the molar amount of $B_2O_3$ relative to other components (where the molar proportion of M is 1) from about 0.02 to 0.2 (z in formulas herein) results in blue-emitting phosphors with acceptable persistence and brightness. Inclusion of the flux in a molar proportion z=about 0.08 to about 0.15 is preferred and inclusion of flux in a molar proportion z=about 0.1 to about 0.15 is more preferred.

$B_2O_3$ can be replaced in all formulations of this invention by an amount of $H_3BO_3$ sufficient to provide an equivalent molar amount of B (i.e., $2H_3BO_3$ replaces each $B_2O_3$).

The exact role of the flux $B_2O_3$ in the phosphor properties is not clear. However, the phosphorescent phase in the compounds of this invention cannot be obtained without the use of flux. It is believed that the presence of flux is important to obtaining a particular phosphorescent phase with improved properties. The presence or absence of flux in the preparation of strontium aluminates can affect the ultimate structure of the aluminate. For example, when m=1.75 and M=Sr, the host material becomes $Sr_4Al_{14}O_{25}$ with an orthorhombic structure with space group Pmma in the presence of flux (e.g., $B_2O_3$). This structure of strontium aluminate can be made only in the presence of flux. In the case where m=2 and M=Sr, the host material $SrAl_4O_7$ formed in the presence of flux is similar in structure to orthorombic $Sr_4Al_{14}O_{25}$ (see FIG. 4). This material is monoclinic with space group $C_{2h}^6$-C2/c when synthesized without flux (e.g., $B_2O_3$).

The phosphors of this invention can be made by the following general method. Phosphor components are combined as indicated in stoichiometric formulas (with or without a flux). The mixture is treated to form a homogeneous fine powder, for example by milling or grinding. The powder is preferably pressed into pellets. The powder or pellets are prefired at temperatures between about 600 to 800° C. (dependent upon the phase transitions of the material) in air for about 1–2 hrs. The prefired material is again treated to form a fine homogeneous powder (e.g., milling, grinding, pulverizing) suitable for sintering. Preferably, the powder is pelleted before sintering. The powder or pellets are then sintered at about 1300° C. under a reducing atmosphere, e.g., $H_2/N_2$ having 2–5% by volume $H_2$.

Sintered phospor material can be used to grow single crystals or single crystal fibers. Any crystallization technique can be employed. The laser heated pedestal method is preferred. Sintered pellets are cut into bars to introduction into the crystal growth chamber (1×1 mm/1.5×1.5 mm pieces). The bars are carefully cleaned prior to introduction into the chamber which is filled with an non-reactive or inert gas (e.g., $N_2$) or a somehat reducing gas (<about 1% by volume $H_2$ in $N_2$). Care should be taken to minimize or avoid reoxidation of $Eu^{2+}$ ions and to minimize or avoid reduction to the monovalent or zero valent (i.e., metal) state. Other metals in the materials preferably remain in the same oxidation state during crystallization. A pointed ceramic bar can be used as a "seed" to stimulate spontaneous nucleation in the LHPG process. It was observed that the initial part of the fiber prepared by the LHGP process was a twined crystal. The fiber eventually becomes one single crystal after a transition stage, but the crystal is not oriented. Fiber lengths of single crystals grown are variable, but can be as long as several centimeters in length. Single crystals with an average diameter of about 0.8 mm can be grown.

The basic phosphors of this invention are most generally prepared by admixing the components in the following molar proportions:

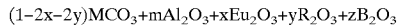
$(1-2x-2y)MCO_3+mAl_2O_3+xEu_2O_3+yR_2O_3+zB_2O_3$ and will have the general formula:

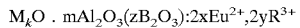
$M_kO \cdot mAl_2O_3(zB_2O_3):2xEu^{2+},2yR^{3+}$       3 where k=1−2x−2y, m is a number ranging from about 1.6 to about 2.2, x can range from about 0.0001 to about 0.05 and is preferably about 0.001 to about 0.005, y can range from about 0.0001 to about 0.10 and the value of y is preferably equal to the value of x and z can range from about 0.02 to about 0.2. M is most generally an alkaline earth metal, but is preferably Sr or a mixture of Sr with Ca, Ba or both. $R^{3+}$ is generally one or more trivalent metal ions, but is preferably a trivalent metal ion selected from the group: $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, and $Yb^{3+}$ and $Bi^{3+}$. Preferred trivalent codopants are $Pr^{3+}$, $Ho^{3+}$, $Dy^{3+}$, and $Nd^{3+}$. Co-doping of $Dy^{3+}$ or $Y^{3+}$ along with other trivalent metal ions improves brightness of other phosphors of this invention.

The combined phosphor components are milled or ground into a homogeneous fine powder, optionally pressed into pellets and prefired in air for about 1 hr at about 600° C. The prefired material is remilled or ground into a fine powder for sintering. The powder is optionally pressed before sintering. The material is sintered at about 1300° C. for one hour in a reducing atmosphere, such as a mixture of $N_2$ and $H_2$ (about 1–5% by volume).

Phosphors of this invention include those in which two trivalent metal ions are doped into the matrix having the general formula:

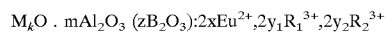
$M_kO \cdot mAl_2O_3 (zB_2O_3):2xEu^{2+},2y_1R_1^{3+},2y_2R_2^{3+}$       4 where k=1−2x−2y, m is as defined above, $y_1+y_2=y$, and $R_1$ and $R_2$ are two different trivalent metal ions. The number x can range from about 0.0001 to about 0.05 and is preferably about 0.001 to about 0.005, y can range from about 0.0001 to about 0.10 and the value of y is preferably equal to the value of x and z can range from about 0.02 to about 0.2. Preferred phosphors contain about equal amounts of $R_1$ and $R_2$.

The phosphors of this invention include those in which $Al^{3+}$ in the host is substituted by a divalent metal ion, particularly $Mg^{2+}$ or $Zn^{2+}$. These phosphors have the general formula:

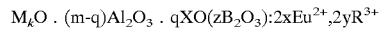
$M_kO \cdot (m-q)Al_2O_3 \cdot qXO(zB_2O_3):2xEu^{2+},2yR^{3+}$       5 where k=1−2x−2y, m is as defined above, x can range from about 0.0001 to about 0.05 and is preferably about 0.001 to about 0.005, y can range from about 0.0001 to about 0.10 and the value of y is preferably equal to the value of x and z can range from about 0.02 to about 0.2. XO is a metal oxide, preferably MgO or ZnO and q can range from about 0.0001 to about 0.20. The amount of divalent ion (q) from XO added to the matrix to replace $Al^{3+}$ is preferably equal to the amount of $R^{+3}$ doped into the matrix (i.e., the value of q preferably=the value of 2y.

The phosphors of this invention include those in which $M^{2+}$ in the host is substituted by a monovalent alkali metal ion, particularly $Na^+$ or $K^+$. These phosphors have the general formula:

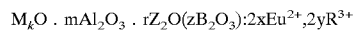
$M_kO \cdot mAl_2O_3 \cdot rZ_2O(zB_2O_3):2xEu^{2+},2yR^{3+}$       6 where k=1−2x−2y−2r, m is as defined above, x can range from about 0.0001 to about 0.05 and is preferably about 0.001 to about 0.005, y can range from about 0.0001 to about 0.10 and the value of y is preferably equal to the value of x and z can range from about 0.02 to about 0.2. $Z_2O$ is an alkali metal oxide, preferably $Na_2O$ or $K_2O$ and r can range from about 0.0001 to about 0.20. The amount of monovalent ion (2r) added to the matrix to replace $M^{2+}$, is preferably equal to the amount of $R^{3+}$ doped into the matrix (i.e., the value of r preferably=the value of y). A slight excess over the desired or preferred amount of $Z_2O$ may be added to compensate for any $Z^+$ that may be vaporized during sintering.

The formulas 1–6 are intended to represent the chemical composition of the phosphor and do not indicate structure.

The phosphors of this invention can be prepared as powders or ceramics as indicated in the examples. Materials of this invention can be used to prepare single crystal phosphors as described, for example, in Example 17.

The phosphors of this invention have a variety of applications for the manufacture of luminous materials, including paints, inks, plastic articles, toys, jewelry, ornaments and apparel. The phosphors have application in night vision apparatus and in optoelectronic devices. The phosphors of this invention can for example be employed in detection of UV radiation.

More specifically this invention provides:

A. A phosphorescent material comprising:

a host with chemical formula: $MO \cdot mAl_2O_3$, where M is an alkaline earth metal, and m is a number ranging from about 1.6 to about 2.2, the host containing from about 0.01 mol % to about 5 mol %, relative to M, of an activator, and containing from about 0.01 mol % to about 5 mol %, relative to M, of a trivalent metal ion dopant selected from the group of trivalent ions $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, and $Yb^{3+}$ and $Bi^{3+}$.

A phosphorescent material as in paragraph A further comprising from about 2 mol % to about 20 mol %, relative to M, of $B_2O_3$ in said host and/or wherein $B_2O_3$ is present in the host in an amount ranging from about 8 mol % to about 15 mol %, relative to M.

A phosphorescent material as in paragraph A where m is 2 or 1.75 and/or wherein M is $Sr^{2+}$.

B. A phosphorescent material having the formula:

$$M_kO \cdot mAl_2O_3 \, (zB_2O_3):2xEu^{2+},2yR^{3+},$$

where: k is $1-2x-2y$, m is a number ranging from about 1.6 to about 2.2;

z is a number ranging from about 0.02 to about 0.2 x is a number ranging from about 0.0001 to about 0.005;

y is a number ranging from about 0.0001 to about 0.010

M is $Sr^{2+}$ or a mixture of $Sr^{2+}$ with $Ca^{2+}$, $Ba^{2+}$ or both;

$R^{3+}$ is one or more of $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, $Yb^{3+}$ and $Bi^{3+}$.

A phosphorescent material as defined in paragaph B wherein $R^{3+}$ is $Pr^{3+}$, $Ho^{3+}$, $Dy^{3+}$, or $Nd^{3+}$ and/or wherein x ranges from about 0.001 to about 0.005 and y=x. Preferred phosphorescent material of paragraph B are those in which m is equal to 1.75 or 2.

C. A phosphorescent material of having the formula:

$$M_kO \cdot mAl_2O_3 \, (zB_2O_3):2xEu^{2+},2y_1R_1^{3+},2y_2R_2^{3+},$$

where k is $1-2x-2y$, with $y=y_1+y_2$;

m is a number ranging from about 1.6 to about 2.2;

z is a number ranging from about 0.02 to about 0.2 x is a number ranging from about 0.0001 to about 0.005;

y is a number ranging from about 0.0001 to about 0.010

M is $Sr^{2+}$ or a mixture of $Sr^{2+}$ with $Ca^{2+}$, $Ba^{2+}$ or both;

$R_1^{3+}$ and $R_2^{3+}$ are different trivalent metal ions that are one or more of $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, $Yb^{3+}$, and $Bi^{3+}$.

A phosphorescent material of paragraph C wherein $R_1^{3+}$ and $R_2^{3+}$ are one or more of $Pr^{3+}$, $Ho^{3+}$, $Nd^{3+}$, $Dy^{3+}$, and $Y^{3+}$. Preferred phosphorescent materials of paragraph C are those wherein $R_1^{3+}$ is $Pr^{3+}$, $Ho^{3+}$, $Dy^{3+}$, or $Nd^{3+}$ and $R_2^{3+}$ is $Y^{3+}$.

A phosphorescent material of paragraph C wherein M is $Sr^{2+}$ and/or wherein m=1.75 or 2.

D. A phosphorescent material having the formula:

$$M_kO \cdot (m-q)Al_2O_3 \cdot qXO(zB_2O_3):2xEu^{2+},2yR^{3+},$$

where k is $1-2x-2y$, m is a number ranging from about 1.6 to about 2.2;

z is a number ranging from about 0.02 to about 0.2 x is a number ranging from about 0.0001 to about 0.005;

y is a number ranging from about 0.0001 to about 0.010;

M is $Sr^{2+}$ or a mixture of $Sr^{2+}$ with $Ca^{2+}$, $Ba^{2+}$ or both;

$R^{3+}$ is one or more of $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, $Yb^{3+}$ and $Bi^{3+}$;

X is a divalent metal ion selected from $Mg^{2+}$ or $Zn^{2+}$; and q can range from about 0.0001 to about 0.030.

A preferred phosphorescent material of paragraph D has q equal to 2y.

E. A phosphorescent material having the formula:

$$M_kO \cdot mAl_2O_3 \cdot rZ_2O(zB_2O_3):2xEu^{2+},2yR^{3+},$$

where $k=1-2x-2y-2r$;

x ranges from about 0.0001 to about 0.05;

y is a number ranging from about 0.0001 to about 0.10;

z ranges from about 0.02 to about 0.2;

Z is an alkali metal ion, particularly $Na^+$ or $K^+$ and r ranges from 0 to 0.20.

A preferred phosphorescent material of paragraph E has r=the value of y.

F. A phosphorescent material having the formula:

$$Sr_kBa_pCa_nO \cdot mAl_2O_3(zB_2O_3):2xEu^{2+},2yR^{3+},$$

where $k=1-n-p-2x-2y$, where k is greater than 0;

n and p are numbers greater than or equal to 0 and less than 1;

m is a number ranging from about 1.6 to about 2.2;

z is a number ranging from about 0.02 to about 0.2 x is a number ranging from about 0.0001 to about 0.005;

y is a number ranging from about 0.0001 to about 0.010; and $R^{3+}$, is one or more of $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, $Yb^{3+}$ and $Bi^{3+}$.

Phosphorescent materials of paragaphs A–E can be in ceramic or single crystal form.

THE EXAMPLES

Example 1

Methods of Preparation of Blue Phosphors with Host Material $MAl_4O_7$ (where M is Sr or a mixture of Sr with Ba and/or Ca)

Phosphor components are mixed according to the molar proportions in the following general recipes:

$$(1-2x-2y)MCO_3+2.00 \, Al_2O_3+xEu_2O_3+yR_2O_3+zB_2O_3;$$

where:

2x+2y is less than 1, preferably x=about 0.0001 to about 0.05 and more preferably x=about 0.001 to about 0.005;

y is a number ranging from about 0.0001 to about 0.010 and preferably the value of y=the value of x;

z ranges from about 0.02 to about 0.2;

M is Sr or a combination of Sr with Ca and/or Ba; and

R is a trivalent rare earth metal ion or $Bi^{2+}$.

$B_2O_3$ is used as a flux in the composition and is important for ensuring the formation of the phosphorescent phase. $B_2O_3$ can be replaced by two molar equivalents of $H_3BO_3$.

The mixture of components is milled or ground to form a homogeneous fine powder for prefiring. The powder is preferably pressed into pellets under about 1.3 ton/cm² pressure prior to prefiring. The mixed powder or the pressed pellets are then prefired at about 600° C. in air for about one hour. The prefired material is then pulverized and milled again into a fine powder suitable for sintering. The prefired powder is preferably again pressed into ceramic pellets under 1.3 ton/cm² pressure before sintering. The powder or pellets are then sintered at about 1,300° C. for one hour in $H_2$—$N_2$ gas flow containing about 2–5% $H_2$ (by volume) at a flow rate of about 0.1 liter per minute. The resulting material exhibits phosphor properties as described herein.

Example 2

Preparation and Characterization of $SrAl_4O_7(B_2O_3)$ :$Eu^{2+}$,$Pr^{3+}$ Phosphors The methods and phosphors of this invention are specifically exemplified by preparation of $SrAl_4O_7(0.1B_2O_3):Eu^{2+}$, $R^{3+}$ ($Eu^{2+}$ and $R^{3+}$ co-doped strontium aluminate) phosphors. These methods of preparation also specifically apply to $Sr_4Al_{14}O_{25}:Eu^{2+},R^{3+}$ phosphors and the properties exhibited by $SrAl_4O_7:Eu^{2+},R^{3+}$ phosphors generally exemplify those of $Sr_4Al_{14}O_{25}:Eu^{2+},R^{3+}$ phosphors.

$SrAl_4O_7:0.01Eu^{2+}:0.02Pr^{3+}$ is prepared by the general method of Example 1 mixing the components in the following molar proportions:

0.97 $SrCO_3$ + 2.00 $Al_2O_3$ + 0.005 $Eu_2O_3$ + 0.01 $Pr_2O_3$ + 0.1 $B_2O_3$ where $B_2O_3$ serves as a flux. The milled mixed powders are pelletized prior to prefiring and pelletized prior to sintering.

FIG. 1 shows the spectrum of the after-glow of a sample of $SrAl_4O_7:0.01Eu^{2+}:0.02Pr^{3+}$ exposed to a 4 W UV lamp for two minutes. The phosphorescence exhibits a broad band peaking at about 488 nm with a bandwidth of about 65 nm (2640 $cm^{-1}$). The figure illustrates phosphorescence intensity as a function of wavelength 5 sec after exposure (squares), 20 sec after exposure (circles) and 60 sec after exposure (triangles).

Figure 2:
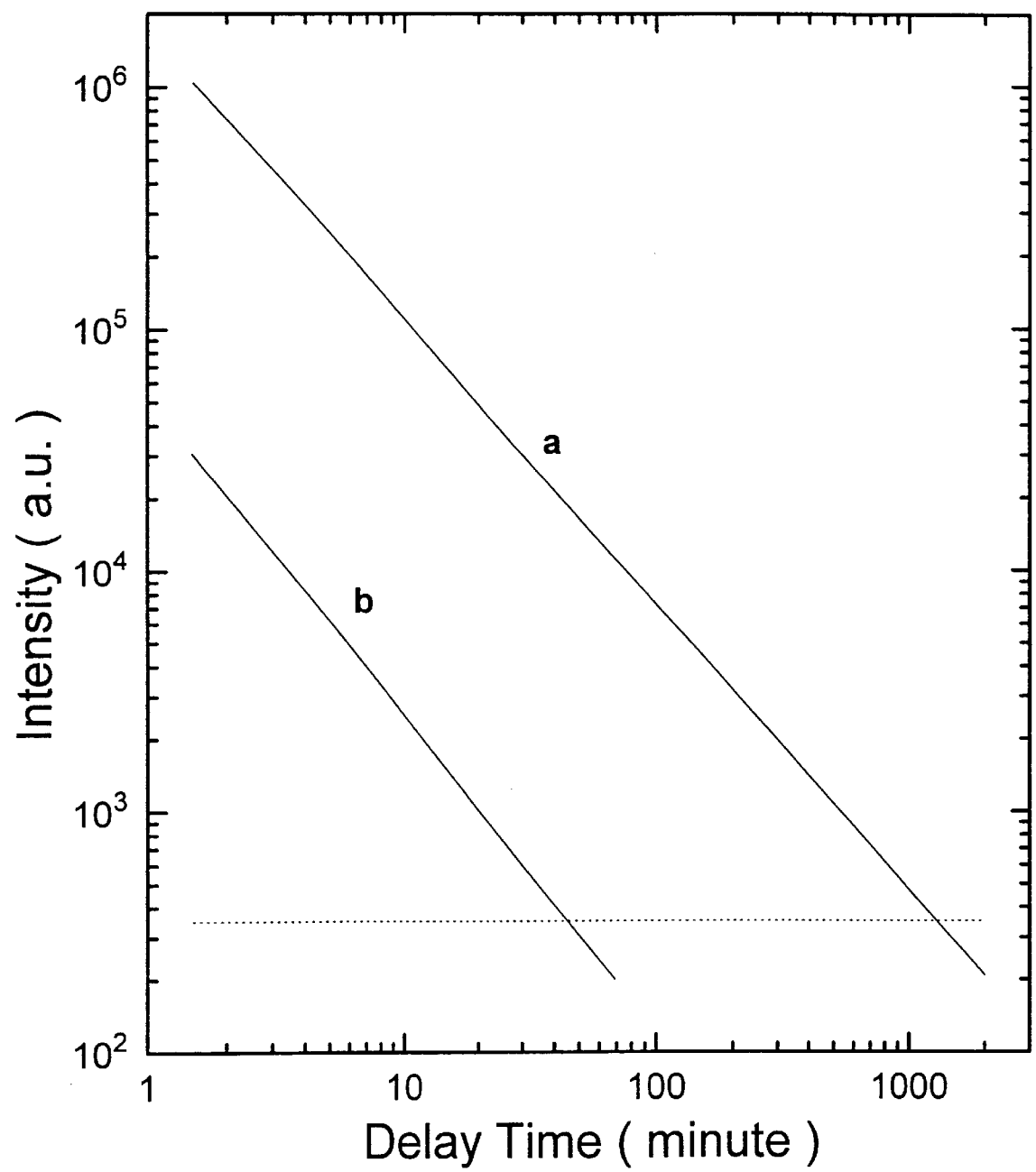
FIG. 2 is a graph of decay of the after-glow of (a) $SrAl_4O_7(0.1B_2O_3)$:$0.01$ $Eu^{2+}$,$0.02Pr^{3+}$; and (b) of commercial blue phosphor CaSrS:Bi after exposure of the phosphors to a 13 W fluorescent lamp for 10 minutes. The threshold of eye sensitivity is indicated by a horizontal dashed line.

FIG. 2 is a graph of decay of the after-glow of a sample of $SrAl_4O_7(0.1B_2O_3):0.01Eu^{2+}:0.02Pr^{3+}$ exposed to a 13 W fluorescent lamp for 10 minutes (line a). For comparison, the decay characteristics of the after-glow of a commercial blue phosphor CaSrS:Bi after similar exposure is also shown (line b). The $SrAl_4O_7(0.1B_2O_3):0.01Eu^{2+}:0.02Pr^{3+}$ phosphor is about 10× brighter than the commercial blue phosphor and has a persistence time about 20 times longer. After 18 hours $SrAl_4O_7(0.1B_2O_3):0.01 Eu^{2+}:0.02Pr^{3+}$ intensity is still well above the threshold of eye-sensitivity (the horizontal dashed line).

Figure 3:
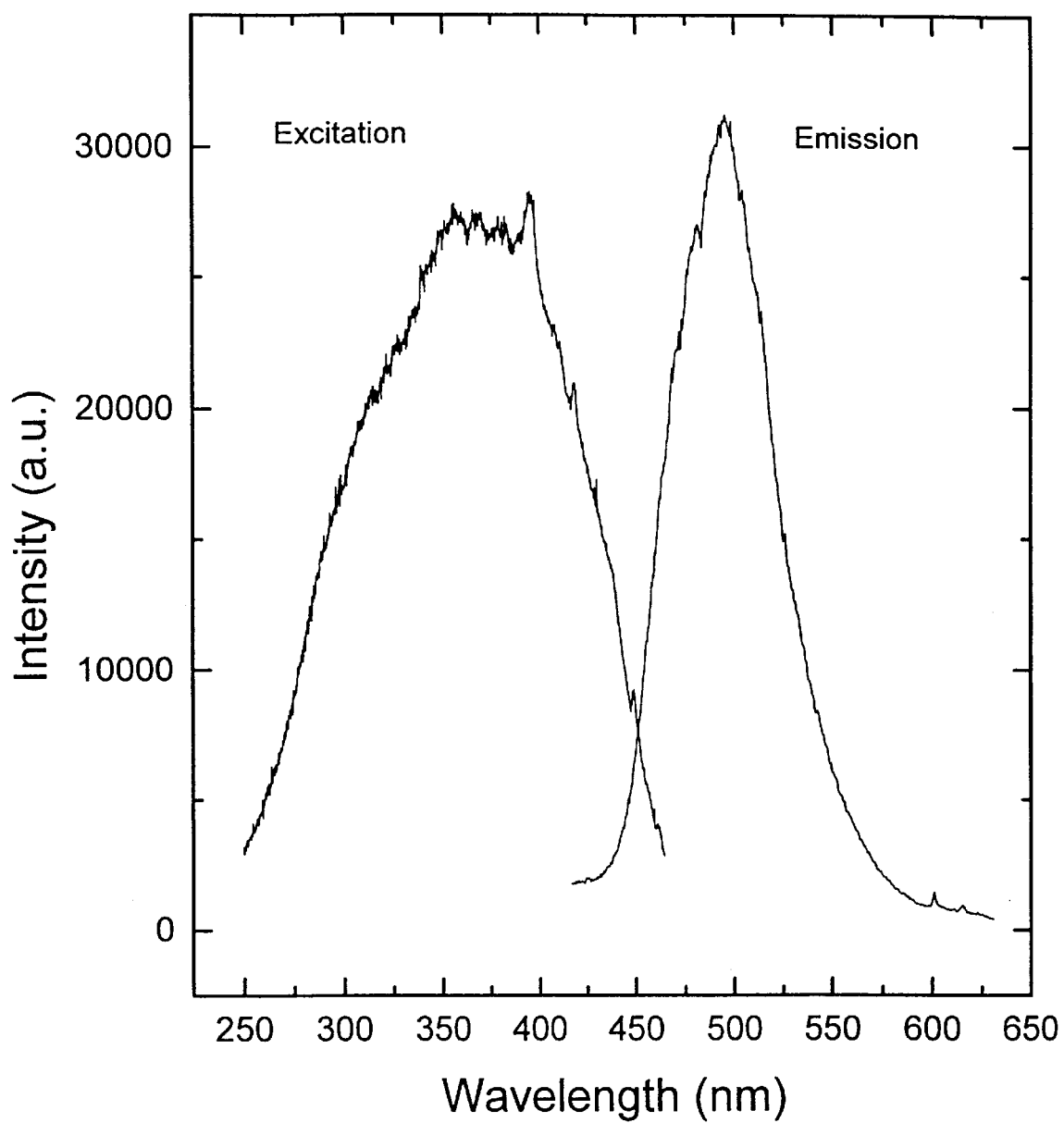
FIG. 3 illustrates the excitation and emission spectra of $SrAl_4O_7(0.1B_2O_3)$:$0.01Eu^{2+}$,$0.02Pr^{3+}$ where excitation was monitored at 488 nm.

FIG. 3 presents the excitation and emission spectra of $SrAl_4O_7(0.1B_2O_3):0.01Eu^{2+}:0.02Pr^{3+}$ where the excitation spectrum was monitored at 488nm.

Figure 4:
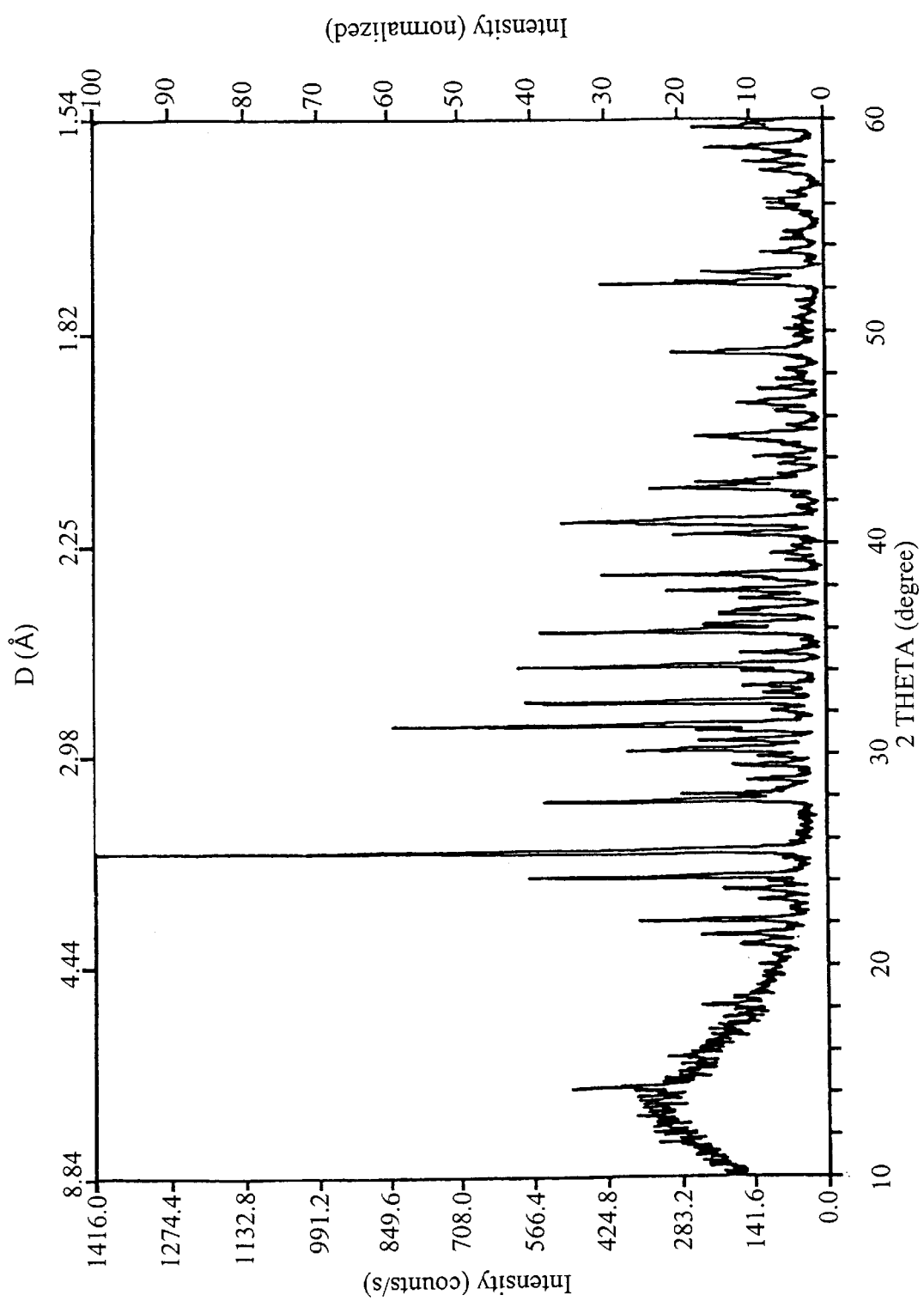
FIG. 4 is the X-ray diffraction pattern of a sample of $SrAl_4O_7(0.1B_2O_3)$:$0.01$ $Eu^{2+}$,$0.02Pr^{3+}$.

FIG. 4 is the x-ray diffraction pattern of the $SrAl_4O_7(0.1B_2O_3):0.01Eu^{2+}:0.02Pr^{3+}$ sample. This x-ray pattern indicated that the structure of $SrAl_4O_7(0.1B_2O_3)$ is similar to $Sr_4Al_{14}O_{25}(0.3B_2O_3)$.

Example 3

Preparation and Characterization of $SrAl_4O_7(B_2O_3)$ :$Eu^{2+}$:$Pr^{3+}$, Phosphors with Varying Amounts of $Eu^{2+}$ Eu-concentration dependence of $SrAl_4O_7(0.1B_2O_3):Eu^2$, :$Pr^3$ phosphor after-glow was examined by preparing phosphor samples in which x ($Eu_2O_3$ molar concentration) was varied from 0.001 to 0.015.

Phosphors were prepared by the method of Example 1 with components mixed in the following molar proportions:

(1−6x) $SrCO_3$ + 2.00 $Al_2O_3$ + $xEu_2O_3$ + $2xPr_2O_3$ + 0.1 $B_2O_3$ where x was varied from 0.01 to 0.15 as indicated in Table 1. In each case samples were pressed into pellets before prefiring and before sintering.

Table 1 shows time persistence of after-glow of the phosphor as a function of $Eu^{2+}$ content (x) with $Pr^{3+}$ content held at 2x. Data in Table 1 indicate that the longest persistence is obtained with samples where x is 0.001–0.005, with y ($Pr_2O_3$ molar proportion)=2x.

TABLE 1

Eu-Concentration dependence of the after-glow of the samples
$SrAl_4O_7:(0.1B_2O_3)2xEu:4xPr$

| Samples | x = | 10 min after-glow | 30 min after-glow | 60 min after-glow |
|---------|-------|------|------|------|
| B-1 | 0.001 | 100 | 31 | 14 |
| B-2 | 0.003 | 106 | 33 | 15 |
| B-3 | 0.005 | 98 | 31 | 15 |
| B-4 | 0.007 | 60 | 17 | 8 |
| B-5 | 0.010 | 50 | 14 | 6 |
| B-6 | 0.015 | 30 | 9 | 4 |

Example 4

Preparation and Characterization of $SrAl_4O_7$ (0.1$B_2O_3$):$Eu^{2+}$:$Pr^{3+}$ Phosphors with Varying Amounts of $Pr^{3+}$ Pr-concentration dependence of $SrAl_4O_7(0.1B_2O_3):Eu^{2+}$ :$Pr^3$ phosphor after-glow was examined by preparing phosphor samples in which y ($Pr_2O_3$ molar concentration) was varied from 0.005 to 0.02.

Phosphors were prepared by the method of Example 1 with components mixed in the following molar proportions:

(0.99−2y) $SrCO_3$ + 2 $Al_2O_3$ + 0.005 $Eu_2O_3$ + $yPr_2O_3$ + 0.1 $B_2O_3$ where y was varied from 0.005 to 0.02 with $Eu^{2+}$ molar concentration held at 0.01 (2x) as indicated in Table 2.

Table 2 shows time persistence of after-glow of the phosphor as a function of $Pr^{3+}$ content (y) with $Eu^{2+}$ content held at 0.01. Data in Table 2 indicate that the intensity of the after glow is not sensitive to variations in $Pr^{3+}$ in the range examined. However, it is generally preferred to employ lower concentration of Pr (y=x to 2x) because $Pr^{3+}$ absorbs in the range of 450–480 nm due to transitions from the ground state $^3H_4$ to excited states $^3P_0$, $^3P_1$, $^3P_2$.

TABLE 2

Pr-concentration dependence of the after-glow of the samples
$SrAl_4O_7(B_2O_3):0.01Eu:2yPr$

| Samples | y = | 10 min after-glow | 30 min after-glow | 60 min after-glow |
|---------|--------|-----|----|----|
| C-1 | 0.005  | 100 | 31 | 15 |
| C-2 | 0.0075 | 95  | 28 | 15 |
| C-3 | 0.001  | 105 | 34 | 16 |
| C-4 | 0.015  | 91  | 28 | 14 |
| C-5 | 0.02   | 92  | 29 | 16 |

Example 5

Preparation and Characterization of $SrAl_4O_7(B_2O_3)$ :$Eu^{2+}$:$Ho^{3+}$ Blue Phosphors $SrAl_4O_7(0.1B_2O_3):0.01Eu^{2+}:0.02 Ho^{3+}$ was prepared following the general procedure of Example 1 with components mixed in the following molar proportions:

0.97 $SrCO_3$ + 2.00 $Al_2O_3$ + 0.005 $Eu_2O_3$ + 0.01 $Ho_2O_3$ + 0.1 $B_2O_3$ where $B_2O_3$ serves as flux.

Figure 5:
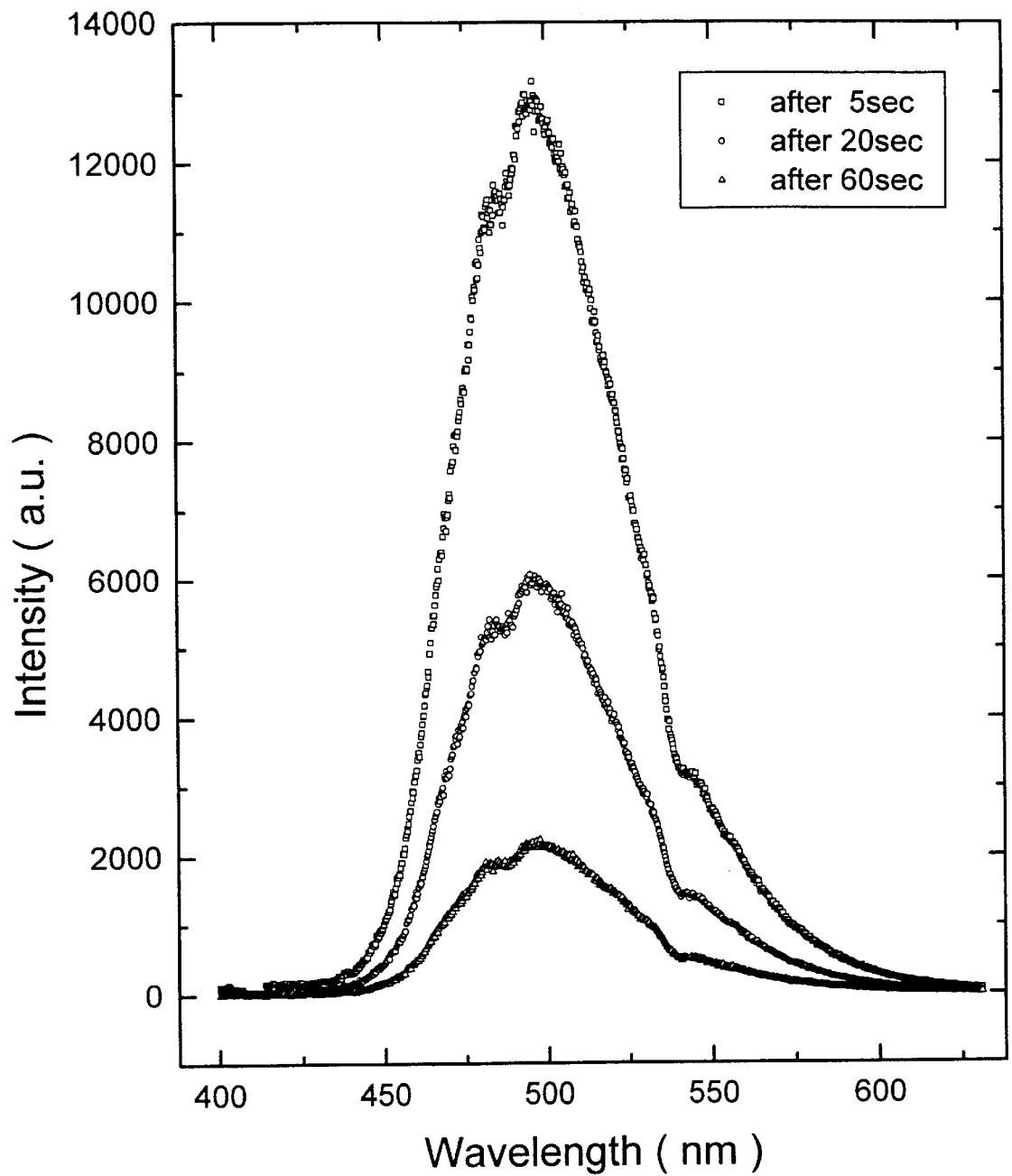
FIG. 5 is a spectrum of the after-glow of a sample of $SrAl_4O_7(0.1B_2O_3)$:$0.01Eu^{2+}$,$0.02Ho^{3+}$, measured at varying times (5–60 sec) after exposure of the sample to a 4 W UV lamp for two minutes.

FIG. 5 shows the spectrum of the after-glow of a sample of $SrAl_4O_7(0.1B_2O_3):0.01 Eu^{2+}:0.02 Ho^{3+}$, exposed to a 4 W UV lamp for two minutes. The phosphorescence exhibits a broad band peaking at about 488 nm with a bandwidth of about 60 nm (2640 cm$^{-1}$). The figure illustrates phosphorescence intensity as a function of wavelength 5 sec after exposure (squares), 20 sec after exposure (circles) and 60 sec after exposure (triangles).

Figure 6:
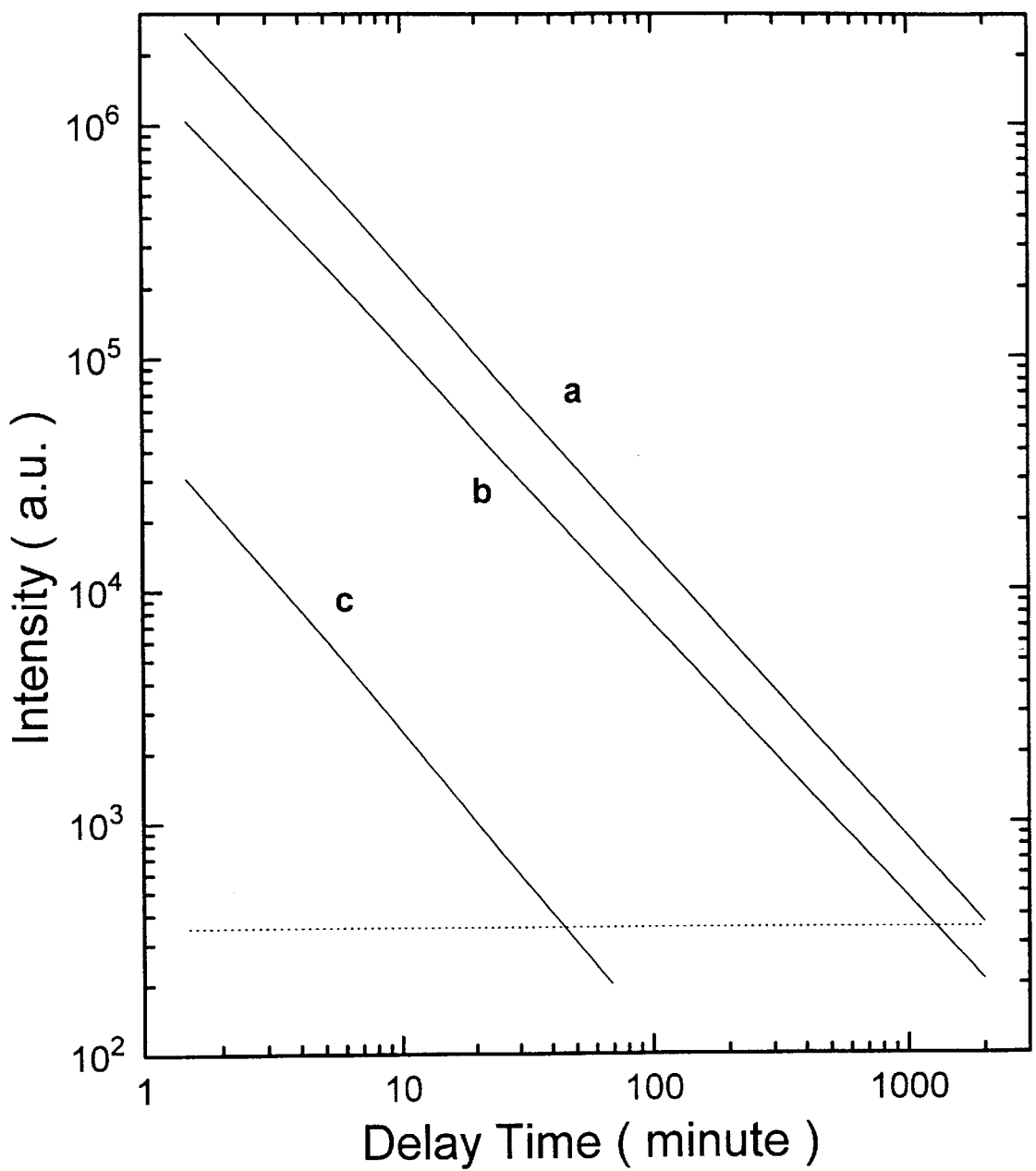
FIG. 6 is a graph of decay of the after-glow of (a) $SrAl_4O_7(0.1B_2O_3)$:$0.01$ $Eu^{2+}$,$0.02Ho^{3+}$; (b) $SrAl_4O_7(0.1B_2O_3)$:$0.01Eu^{2+}$,$0.02Pr^{3+}$ and (c) of commercial blue phosphor CaSrS:Bi after exposure of the phosphors to a 13 W fluorescent lamp for 10 minutes. The threshold of eye sensitivity is indicated by a horizontal dashed line.

FIG. 6 is a graph of decay of the after-glow of a sample of SrAl$_4$O$_7$(0.1B$_2$O$_3$):0.01Eu$^{2+}$:0.02Ho$^{3+}$ exposed to a 13 W fluorescent lamp for 10 minutes (line a). For comparison, the decay characteristics of the after-glow of SrAl$_4$O$_7$ (0.1B$_2$O$_3$):0.01Eu$^{2+}$,0.02Pr$^{3+}$ (line b) and a commercial blue phosphor CaSrS:Bi (c) after similar exposure are also shown. The SrAl$_4$O$_7$(0.1B$_2$O$_3$):0.01Eu$^{2+}$:0.02Ho$^{3+}$ phosphor shows similar brightness and persistence to that of SrAl$_4$O$_7$(0.1B$_2$O$_3$):0.01Eu$^{2+}$,0.02Pr$^{3+}$,. After 20 hours SrAl$_4$O$_7$(0.1B$_2$O$_3$):0.01Eu$^{2+}$:0.02Ho$^{3+}$ intensity is still well above the threshold of eye-sensitivity (the horizontal dashed line).

Figure 7:
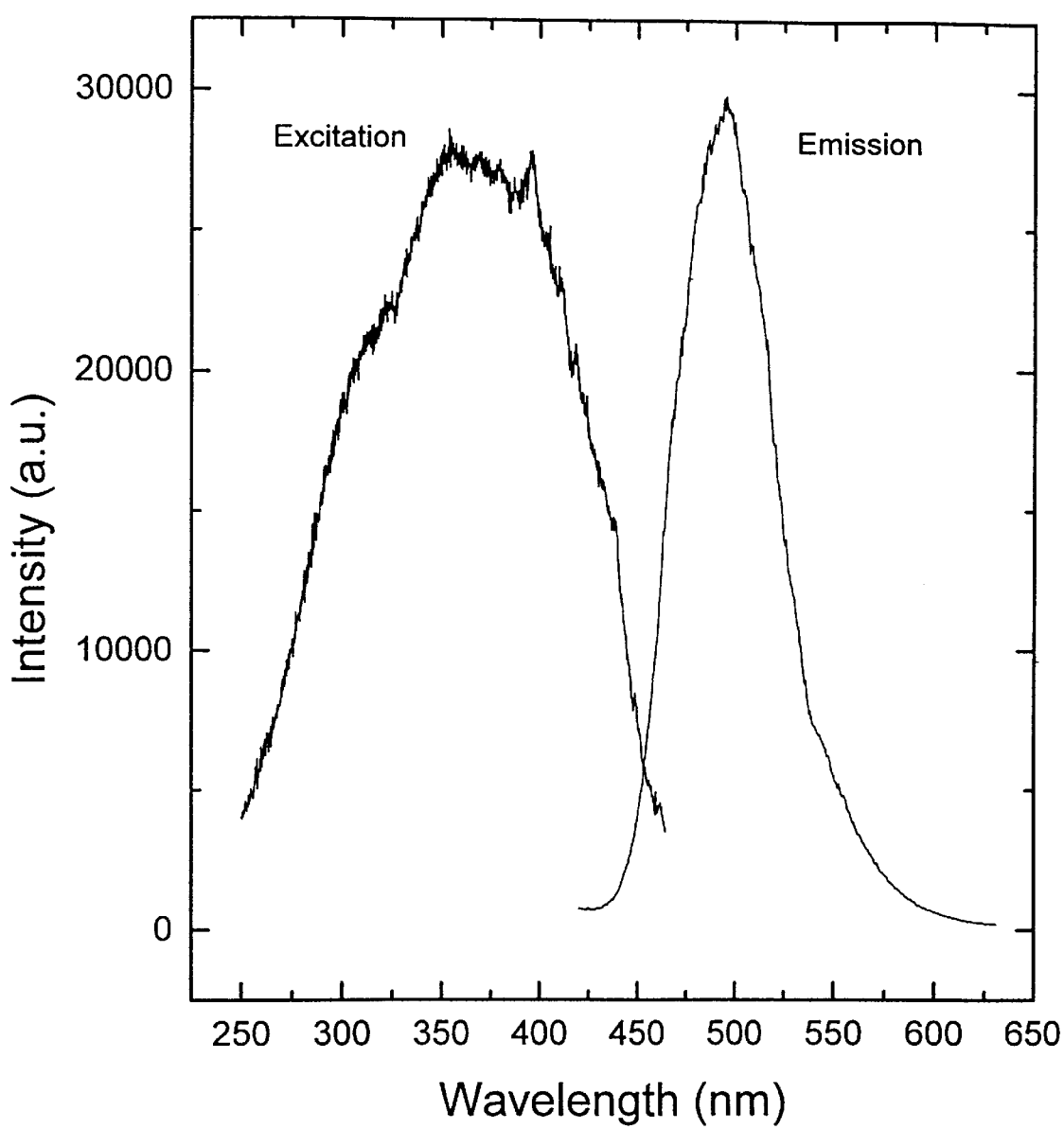
FIG. 7 illustrates the excitation and emission spectra of $SrAl_4O_7(0.1B_2O_3)$:$0.1Eu^{2+}$,$0.02Ho^{3+}$ where excitation was monitored at 488 nm.

FIG. 7 is the excitation and emission spectra of a sample of SrAl$_4$O$_7$(0.1B$_2$O$_3$):0.01Eu$^{2+}$:0.02Ho$^{3+}$ where the excitation spectrum was monitored at 488 nm.

Example 6

Preparation and Characterization of SrAl$_4$O$_7$(B$_2$O$_3$) :Eu$^{2+}$:Nd$^{3+}$ Blue Phosphors SrAl$_4$O$_7$(0.1B$_2$O$_3$):0.01Eu$^{2+}$:0.02 Nd$^{3+}$ was prepared following the general procedure of Example 1 with components mixed in the following molar proportions:

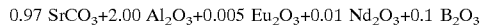
0.97 SrCO$_3$+2.00 Al$_2$O$_3$+0.005 Eu$_2$O$_3$+0.01 Nd$_2$O$_3$+0.1 B$_2$O$_3$ where B$_2$O$_3$ serves as flux.

Figure 8:
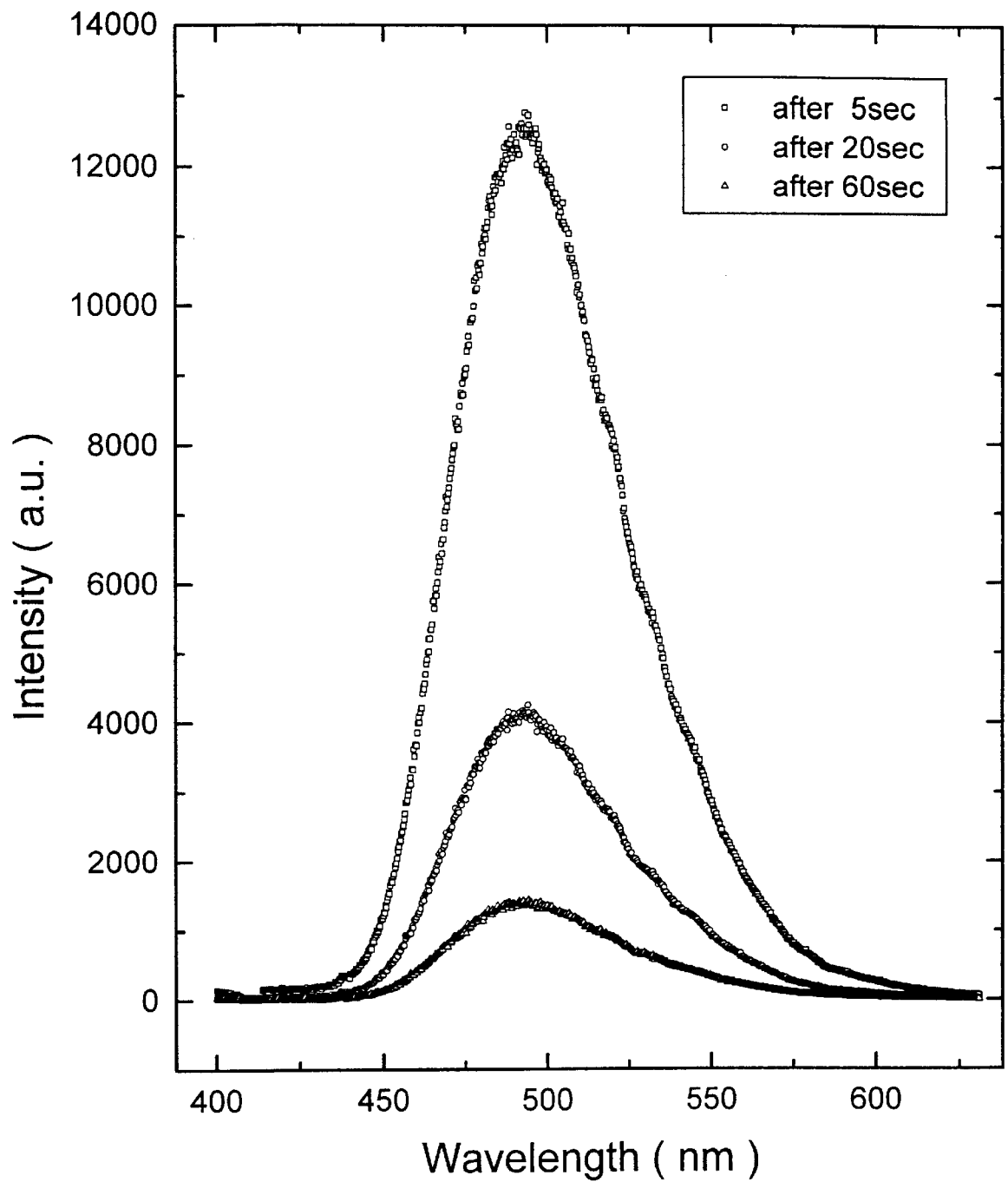
FIG. 8 is a spectrum of the after-glow of a sample of $SrAl_4O_7(0.1B_2O_3)$:$0.01Eu^{2+}$,$0.02Nd^{3+}$ measured at varying time (5–60 sec) after exposure of the sample to a 4 W UV lamp for two minutes.

FIG. 8 shows the spectrum of the after-glow of a sample of SrAl$_4$O$_7$(0.1B$_2$O$_3$):0.0Eu$^{2+}$:0.02 Nd$^{3+}$ exposed to a 4 W UV lamp for two minutes. The phosphorescence exhibits a broad band peaking at about 488 nm with a bandwidth of about 60 nm (2640 cm$^{-1}$). The figure illustrates phosphorescence intensity as a function of wavelength 5 sec after exposure (squares), 20 sec after exposure (circles) and 60 sec after exposure (triangles).

Figure 9:
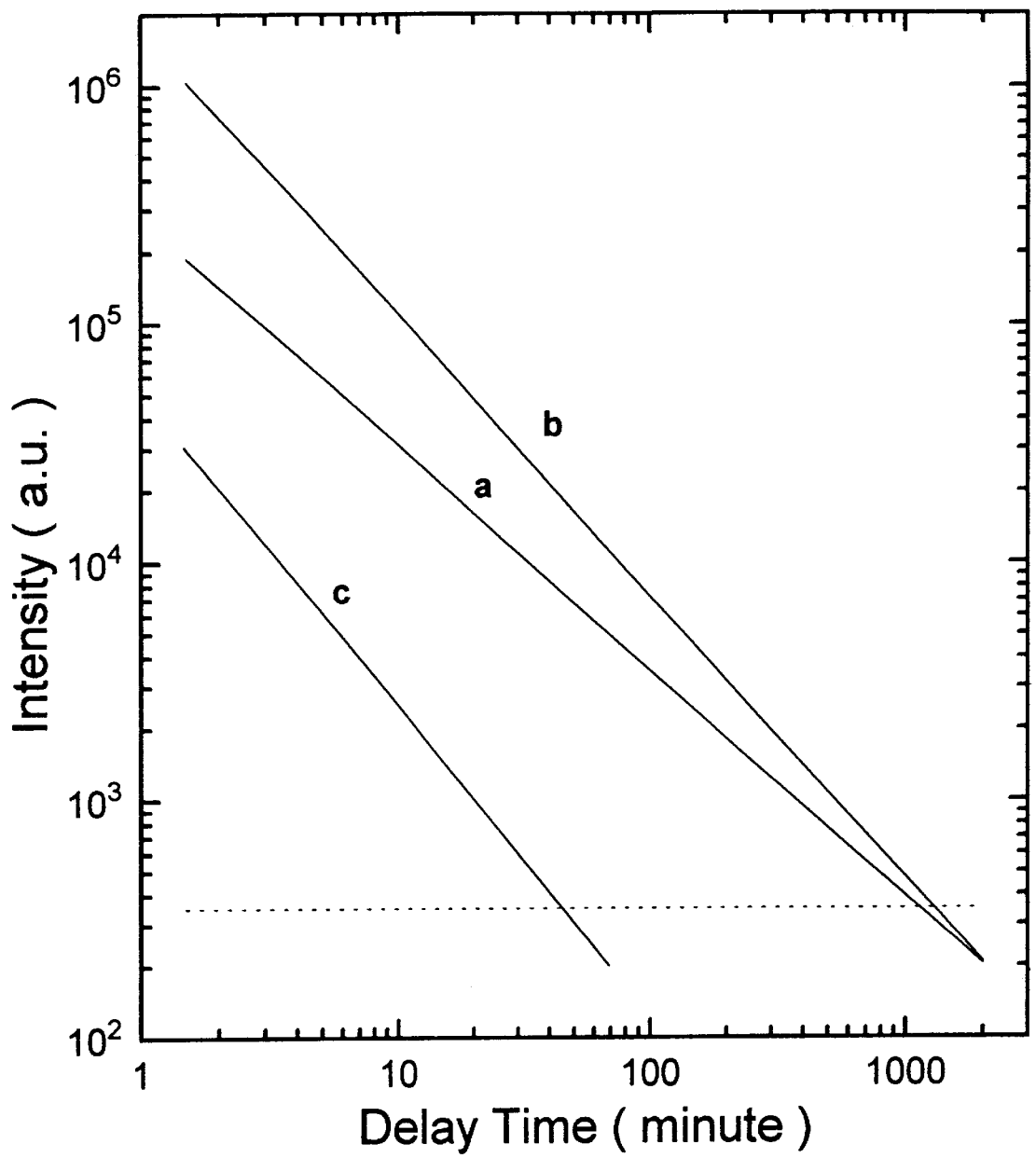
FIG. 9 is a graph of decay of the after-glow of (a) $SrAl_4O_7(0.1B_2O_3)$:$0.01$ $Eu^{2+}$,$0.02Nd^{3+}$; (b) $SrAl_4O_7(0.1B_2O_3)$:$0.01Eu^{2+}$,$0.02Pr^{3+}$ and (c) of commercial blue phosphor CaSrS:Bi after exposure of the phosphors to a 13 W fluorescent lamp for 10 minutes. The threshold of eye sensitivity is indicated by a horizontal dashed line.

FIG. 9 is a graph of decay of the after-glow of a sample of SrAl$_4$O$_7$(0.1B$_2$O$_3$):0.01 Eu$^{2+}$:0.02 Nd$^{3+}$ exposed to a 13 W fluorescent lamp for 10 minutes line (a). For comparison, the decay characteristics of the after-glow of SrAl$_4$O$_7$ (0.1B$_2$O$_3$):0.01 Eu$^{2+}$,0.02Pr$^{3+}$ (b) and a commercial blue phosphor CaSrS:Bi (c) after similar exposure are also shown. The SrAl$_4$O$_7$(0.1B$_2$O$_3$):0.01Eu$^{2+}$:0.02 Nd$^{3+}$ phosphor shows similar brightness and persistence to that of SrAl$_4$O$_7$(0.1B$_2$O$_3$):0.01 Eu$^{2+}$,0.02 Pr$^{3+}$. After 20 hours SrAl$_4$O$_7$(0.1B$_2$O$_3$):0.01 Eu$^{2+}$:0.02 Nd$^{3+}$ intensity is still well above the threshold of eye-sensitivity (the horizontal dashed line).

Figure 10:
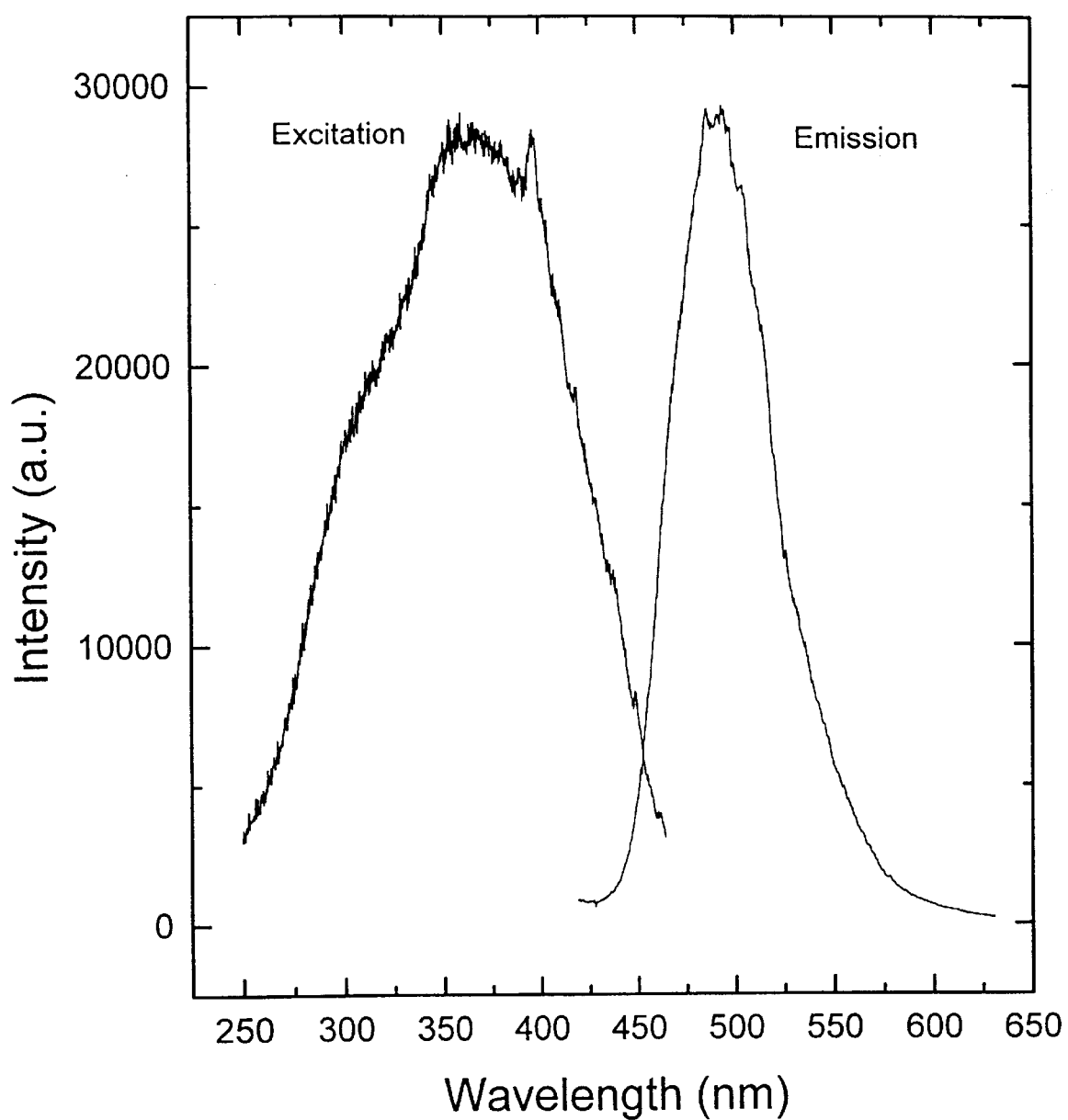
FIG. 10 illustrates the excitation and emission spectra of $SrAl_4O_7(0.1B_2O_3)$:$0.01Eu^{2+}$,$0.02Nd^{3+}$ where excitation was monitored at 488 nm.

FIG. 10 is the excitation and emission spectra of a sample of SrAl$_4$O$_7$(0.1B$_2$O$_3$):0.01 Eu$^{2+}$:0.02 Nd$^{3+}$ where the excitation spectrum was monitored at 488 nm.

Example 7

Preparation and Characterization of Phosphors of Formula SrAl$_4$O$_7$(B$_2$O$_3$):0.01 Eu$^{2+}$,0.02 R$^{3+}$, where R are trivalent metal ions of La, Ce, Sm, Gd, Tb, Dy, Er, Tm, Yb, and Lu.

SrAl$_4$O$_7$(0.1B$_2$O$_3$):0.01Eu$^{2+}$:0.02 R$^{3+}$ were prepared following the general procedure of Example 1 with components mixed in the following molar proportions:

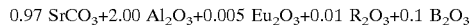
0.97 SrCO$_3$+2.00 Al$_2$O$_3$+0.005 Eu$_2$O$_3$+0.01 R$_2$O$_3$+0.1 B$_2$O$_3$ with R=La, Ce, Sm, Gd, Tb, Dy, Er, Tm, Yb, and Lu.

Figure 11:
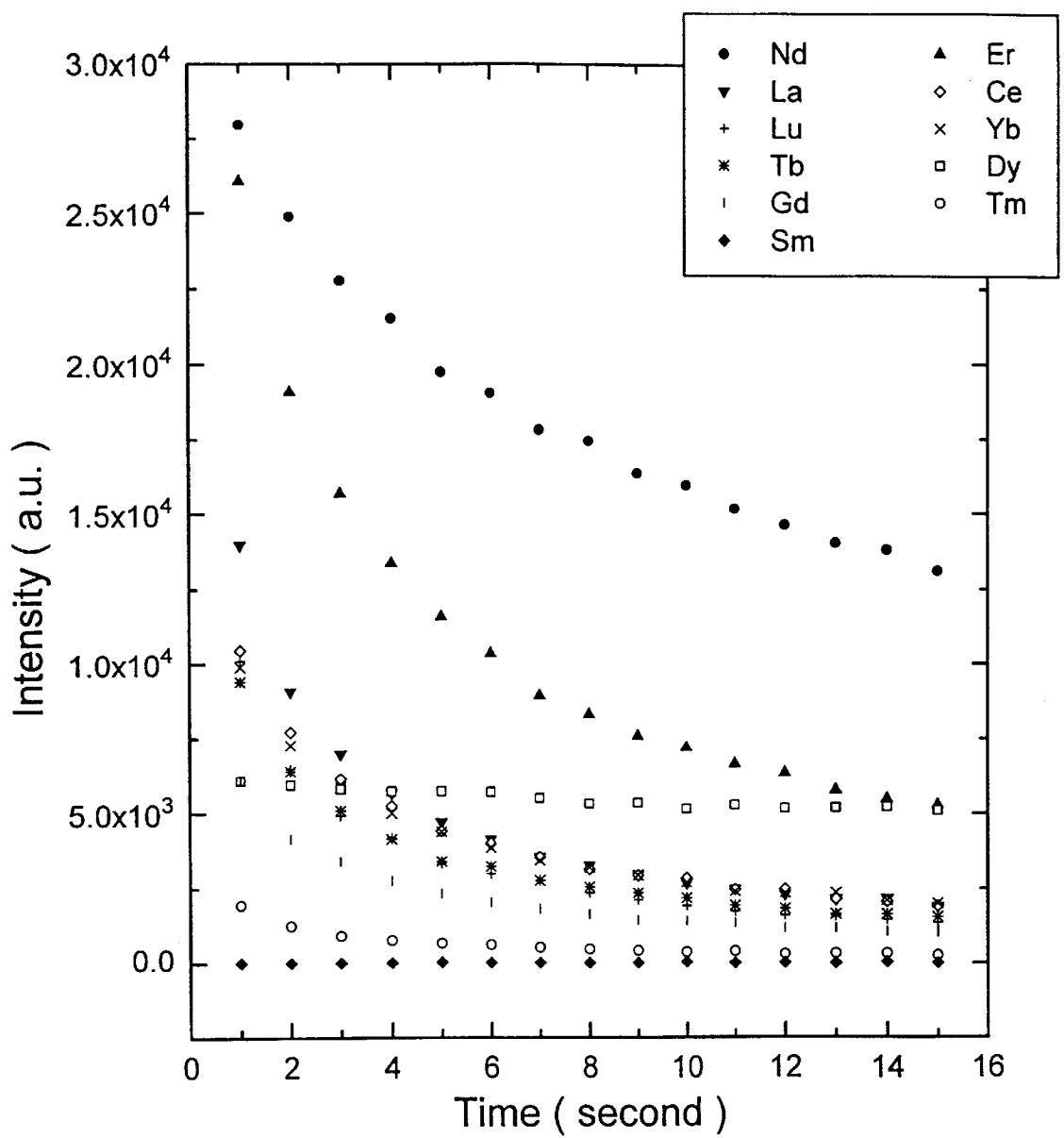
FIG. 11 is a graph of decay curves of the after-glow of $SrAl_4O_7(0.1B_2O_3)$:$0.01Eu^{2+}$,$0.02R^{3+}$ measured in the first 15 sec. after exposure to a 13 W fluorescence lamp (measured at 488 nm). Decay curves for R=La (▼), Ce (◇), Sm (♦), Gd (|), Tb (*), Dy (□), Er (▲), Tm (○), Yb (×), and Lu (+) are shown. The decay curve of the sample $SrAl_4O_7$:Eu,Nd (●) is also shown for comparison.

FIG. 11 shows the decay curves of the after-glow of the SrAl$_4$O$_7$(0.1B$_2$O$_3$):0.01Eu$^{2+}$:0.02 R$^{3+}$ samples measured at 488 nm prepared in the first 15 seconds after exposure to the light of a 13 W fluorescence lamp. Decay curves for R=La (▼), Ce (◇), Sm (♦), Gd (|), Tb (*), Dy (□), Er (▲), Tm (○), Yb (×), and Lu (+). The decay curve of the sample SrAl$_4$O$_7$ (0.1B$_2$O$_3$):Eu,Nd (closed circles) is also shown for comparison. It can be seen that the after-glow of these samples are generally less intense than analogous phosphor samples codoped with Nd. The sample codoped with Dy exhibits much longer decay time (shallower slope) than the Nd codoped phosphor. This indicates that Dy forms a much deeper trapping center than Nb, Ho or Pr.

The luminescence spectra from SrAl$_4$O$_7$(0.1B$_2$O$_3$) :0.01Eu,0.02R where R is La, Er, Nd, and Tm have similar wavelength dependence to that of the phosphor where R is Pr. There is no notable spectral shift with R.

Example 8

Preparation and Characterization of SrAl$_4$O$_7$(B$_2$O$_3$) :0.01 Eu$^{2+}$:0.01 Pr$^{3+}$:0.01R$^{3+}$ where R is La, Lu, Er, Y, and Bi.

This example is intended to determine if co-doping of metal ions into a SrAl$_4$O$_7$(B$_2$O$_3$):Eu$^{2+}$:Pr$^{3+}$ phosphor increases UV excitation efficiency and improves phosphor brightness.

Phosphors are prepared by the method of Example 1 with components combined in the following general molar proportions:

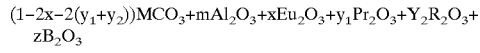
(1−2x−2(y$_1$+y$_2$))MCO$_3$+mAl$_2$O$_3$+xEu$_2$O$_3$+y$_1$Pr$_2$O$_3$+Y$_2$R$_2$O$_3$+ zB$_2$O$_3$ where y$_1$+y$_2$=y, 1−2x−2y=0 and the ranges of in, x, y and z are as in formula 1 above.

More specifically where M=Sr and m=2 the components are combined in the following proportions:

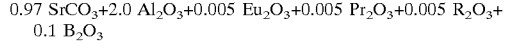
0.97 SrCO$_3$+2.0 Al$_2$O$_3$+0.005 Eu$_2$O$_3$+0.005 Pr$_2$O$_3$+0.005 R$_2$O$_3$+ 0.1 B$_2$O$_3$ where R=Y, La, Lu, Er, and Bi. The intensity of the afterglow of SrAl$_4$O$_7$(0.1B$_2$O$_3$):0.01Eu:0.01Pr:0.01R samples measured at 488 nm relative to that of SrAl$_4$O$_7$(0.1B$_2$O$_3$) :0.01Eu,0.02Pr is given in Table 3. Some results are also shown in FIG. 12.

Figure 12:
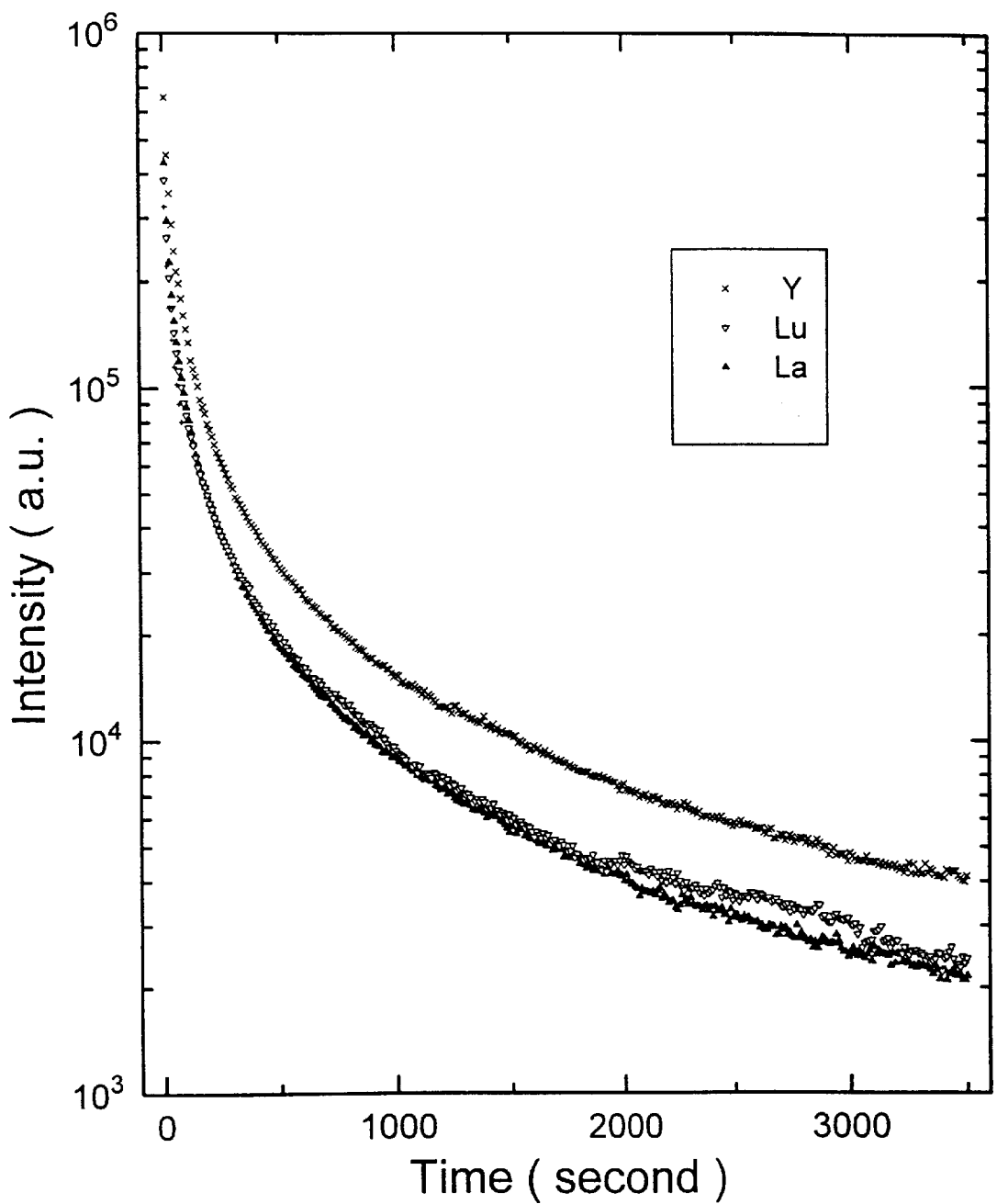
FIG. 12 is a graph comparing after-glow decay curves for samples of $SrAl_4O_7(0.1B_2O_3)$:0.01Eu, 0.01Pr co-doped with 0.01 Y (×), Lu(▽) or La(▲).

FIG. 12 shows decay curves of the after-glow of SrAl$_4$O$_7$ (0.1B$_2$O$_3$):0.01Eu:0.01Pr:0.01R (R=Y$^{3+}$, Lu$^{3+}$, and La$^{3+}$) samples in the first 60 minutes. The samples were exposed to a 4 W UV lamp for two minutes.

Figure 13:
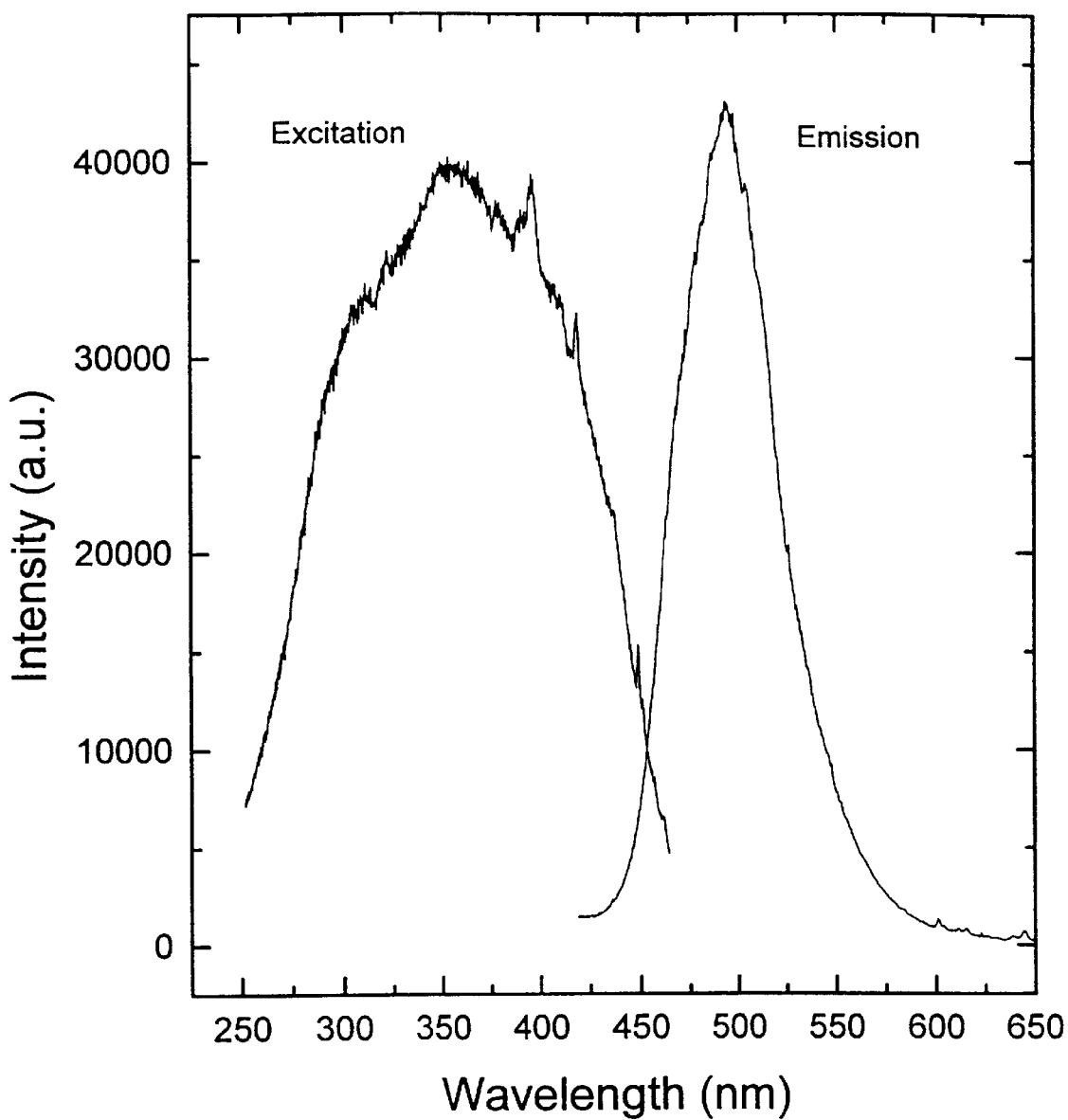
FIG. 13 illustrates the excitation and emission spectra monitored at 488 nm of $SrAl_4O_7(0.1B_2O_3)$ activated with Eu and codoped with Pr and Y.

FIG. 13 is the excitation and emission spectra of the sample SrAl$_4$O$_7$(0.1B$_2$O$_3$):0.01Eu$^{2+}$,0.01Pr$^{3+}$,0.01Y$^{3+}$ where the excitation spectrum was monitored at 488 nm. Codoping with Y$^{3+}$ and Pr$^{3+}$ increases the UV excitation efficiency and improve the brightness by 50% compared to the analogous $Pr^{3+}$-doped phosphor.

TABLE 3

The influence of codoping Y, La, Lu, Er, or Bi into $SrAl_4O_7(B_2O_3):Eu,Pr$ on the phosphorescence at 488 nm

| after (min) | $Pr^1$ | Y | La | Lu | Er | Bi |
|---|---|---|---|---|---|---|
| 10 | 100 | 178 | 105 | 110 | 105 | 107 |
| 30 | 31 | 55 | 30 | 32 | 30 | 33 |
| 60 | 15 | 32 | 16 | 17 | 15 | 18 |

[1]Data is referenced to that of the $SrAl_4O_7(B_2O_3):Eu,Pr$ phosphor.

Example 9

Preparation and Characterization of $SrAl_4O_7$ $(0.1B_2O_3):0.01Eu,0.01Dy,0.01Ho$ and $SrAl_4O_7$ $(0.1B_2O_3):0.01Eu,0.01Dy,0.01Pr$ This example demonstrates the influence of deep trapping centers formed by $Dy^{3+}$ on the decay characteristics of $MAl_4O_7(0.1B_2O_3):0.01Eu$ doped with 0.01Pr or 0.01Ho. Samples are generally prepared by the method of Example 1 combining the components in the following molar proportions:

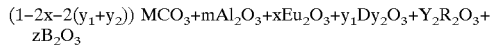

where $y_1+y_2=y$, and m, x, y and z ranges are as described above for formula 1.

For preparation of specific phosphors where M is Sr, the components were combined in the following molar proportions:

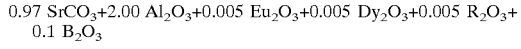

where R=Pr and Ho.

Table 4 provides measurements of relative after-glow intensity at 488 nm of $SrAl_4O_7(0.1B_2O_3):0.01Eu,0.01Dy,$ 0.01Pr and $SrAl_4O_7(0.1B_2O_3):0.01Eu,0.01Dy,0.01Ho$ relative to that of $SrAl_4O_7(0.1B_2O_3):0.01Eu,0.01Pr$. The materials codoped with $Dy^{3+}$ and $Pr^{3+}$ or $Ho^{3+}$ exhibit enhanced brightness and persistence compared to the $Pr^{3+}$ doped or $Ho^{3+}$, doped phosphors.

TABLE 4

The influence of deep centers of Dy on the after-glow of $SrAl_4O_7(0.1B_2O_3):0.01Eu,0.01Pr$ or $SrAl_4O_7(0.1B_2O_3):0.01Eu,0.01Ho$

| after (min) | SAO-EuPr[1] | SAO-EuPrDy | SAO-EuHoDy |
|---|---|---|---|
| 10 | 100 | 301 | 252 |
| 30 | 31 | 99 | 75 |
| 60 | 15 | 47 | 35 |

[1]Data is referenced to that of SAO-EuPr

Figure 14:
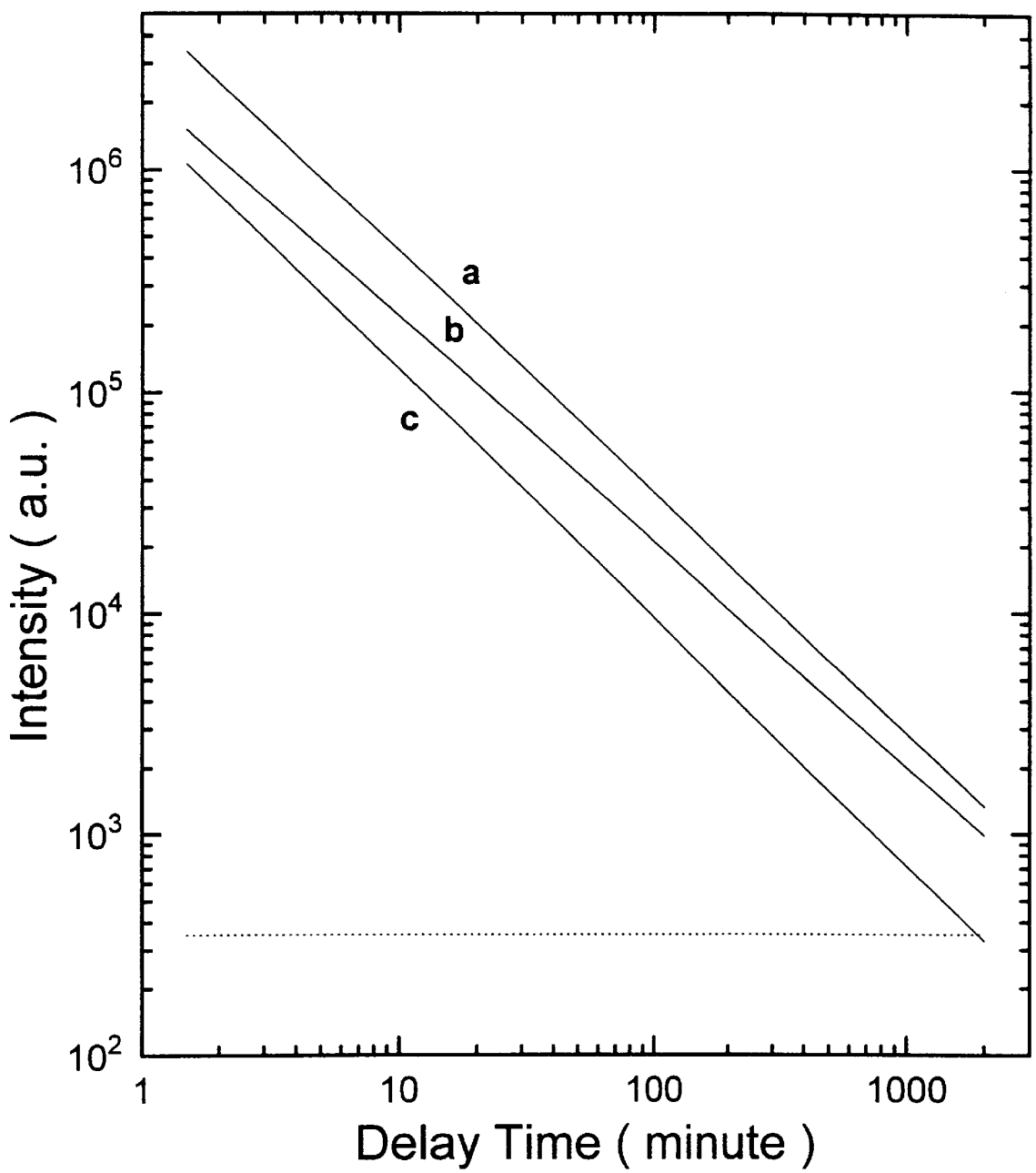
FIG. 14 is a graph comparing after-glow decay curves of $SrAl_4O_7(0.1B_2O_3)$ activated with Eu and codoped with either (a) Pr and Dy, (b) Ho and Dy or (c) doped only with Pr. The threshold of eye sensitivity is indicated by a horizontal dashed line.

FIG. 14 provides decay curves of the after-glow measured at 488 nm of the samples $SrAl_4O_7(0.1B_2O_3):0.01Eu,0.01Pr$ (c); $SrAl_4O_7(0.1B_2O_3):0.01Eu,0.01Pr,0.01Dy$ (a); and $SrAl_4O_7(0.1B_2O_3):0.01Eu,0.01Ho,0.01Dy$(b). The samples were exposed to a 4 W UV lamp for two minutes prior to measurement. Codoping the phosphor with Dy improves phosphor persistence and the brightness.

Example 10

Preparation and Characterization of mixed alkaline earth aluminate phosphors

Mixed alkaline earth aluminate phosphors in which the host contains Sr and Ba are prepared using the general method of Example 1 combining the components in the following general molar proportions:

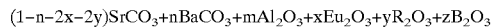

where:

n+2x+2y is less than 1 (there is some Sr present)

y ranges from about 0.0001 to about 0.010 and preferably the value of y=the value of x z ranges from about 0.02 to about 0.2; and $R^{3+}$ is a trivalent rare earth metal ion or $Bi^{3+}$.

The mixed alkaline earth aluminate compound, $(Sr_{0.33}Ba_{0.64})(0.1B_2O_3)Al_4O_7:0.01Eu:0.02Pr$ was prepared following the general procedure of Example 1 combining the components in the following molar proportions:

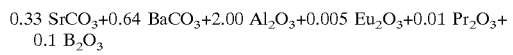

These mixed alkaline earth aluminates have the general formula:

$$Sr_kBa_pO \cdot mAl_2O_3 (zB_2O_3):2xEu, 2yR, \qquad 7$$

where k=1−p−2x−2y.

Figure 15:
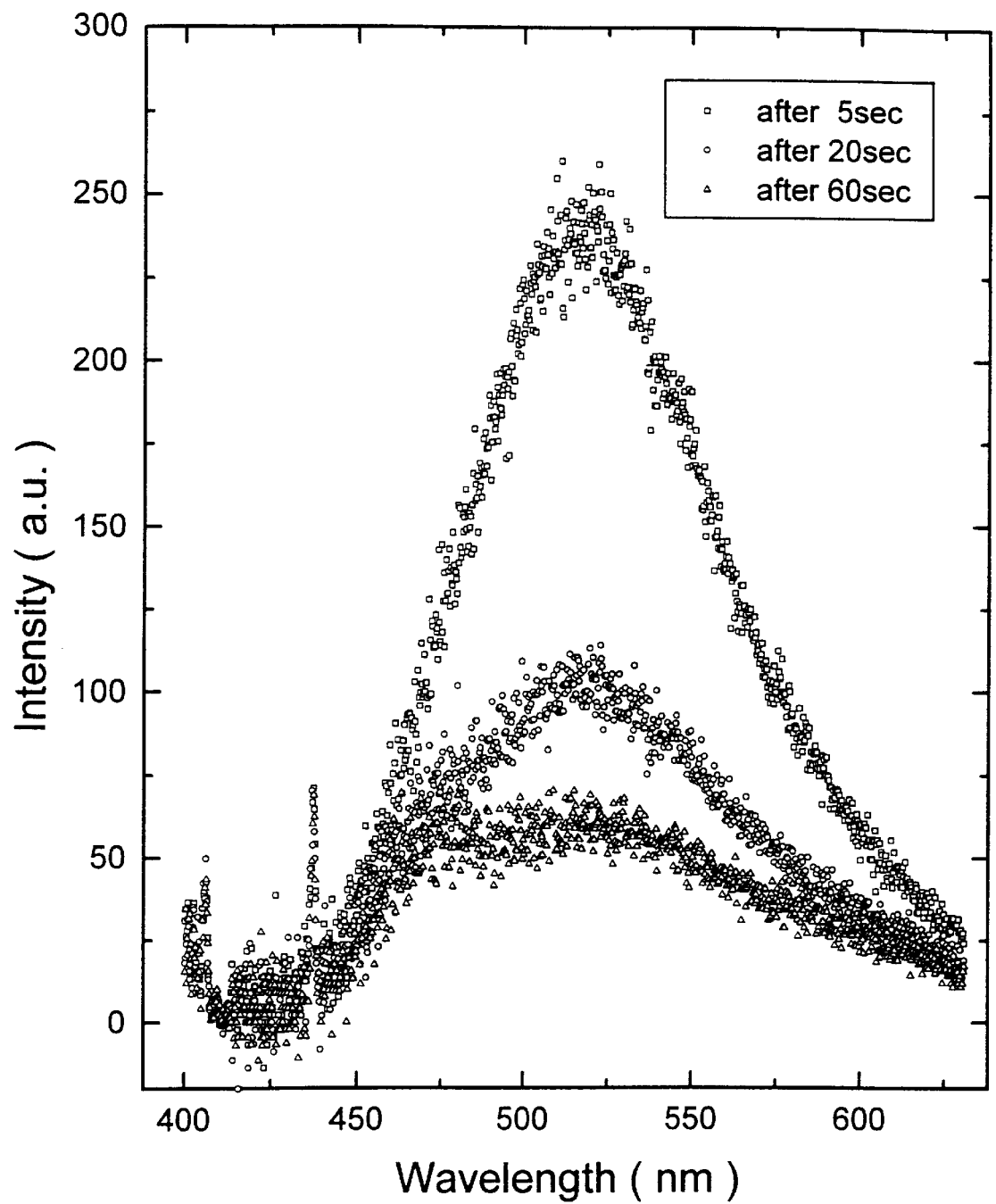
FIG. 15 illustrates the spectra of the after-glow of $Sr_{0.64}Ba_{0.33}Al_4O_7$:0.01Eu, 0.02Pr after exposure to a 4 W UV lamp for 2 minutes as a function of time after illumination (□, after 5 sec.; ○, after 20 sec. and Δ, after 60 sec.).

FIG. 15 shows the luminescence spectra of this phosphor. A small red shift of 27 nm was observed compared to the analogous Sr phosphor.

Example 11

Preparation and Characterization of mixed alkaline earth aluminate phosphors

Mixed alkaline earth aluminate phosphors in which the host contains Sr and Ca are prepared using the general method of Example 1 combining the components in the following general molar proportions:

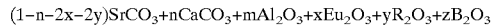

where:

n+2x+2y is less than 1 (there is at least some Sr present)

y ranges from about 0.0001 to about 0.010 and preferably the value of y=the value of x z ranges from about 0.02 to about 0.1; and $R^{3+}$ is a trivalent rare earth ion or $Bi^{3+}$.

These phosphors have the generic formula:

$$Sr_kCa_nO \cdot mAl_2O_3 (zB_2O_3):2xEu,2yR, \qquad 8$$

where k=1−n−2x−2y.

The mixed alkaline earth aluminate compound, $(Sr_{0.485}Ca_{0.485})Al_4O_7:0.01Eu:0.02Pr$ were prepared as in Example 1 combining the components in the following molar proportions:

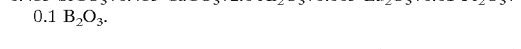

Figure 16:
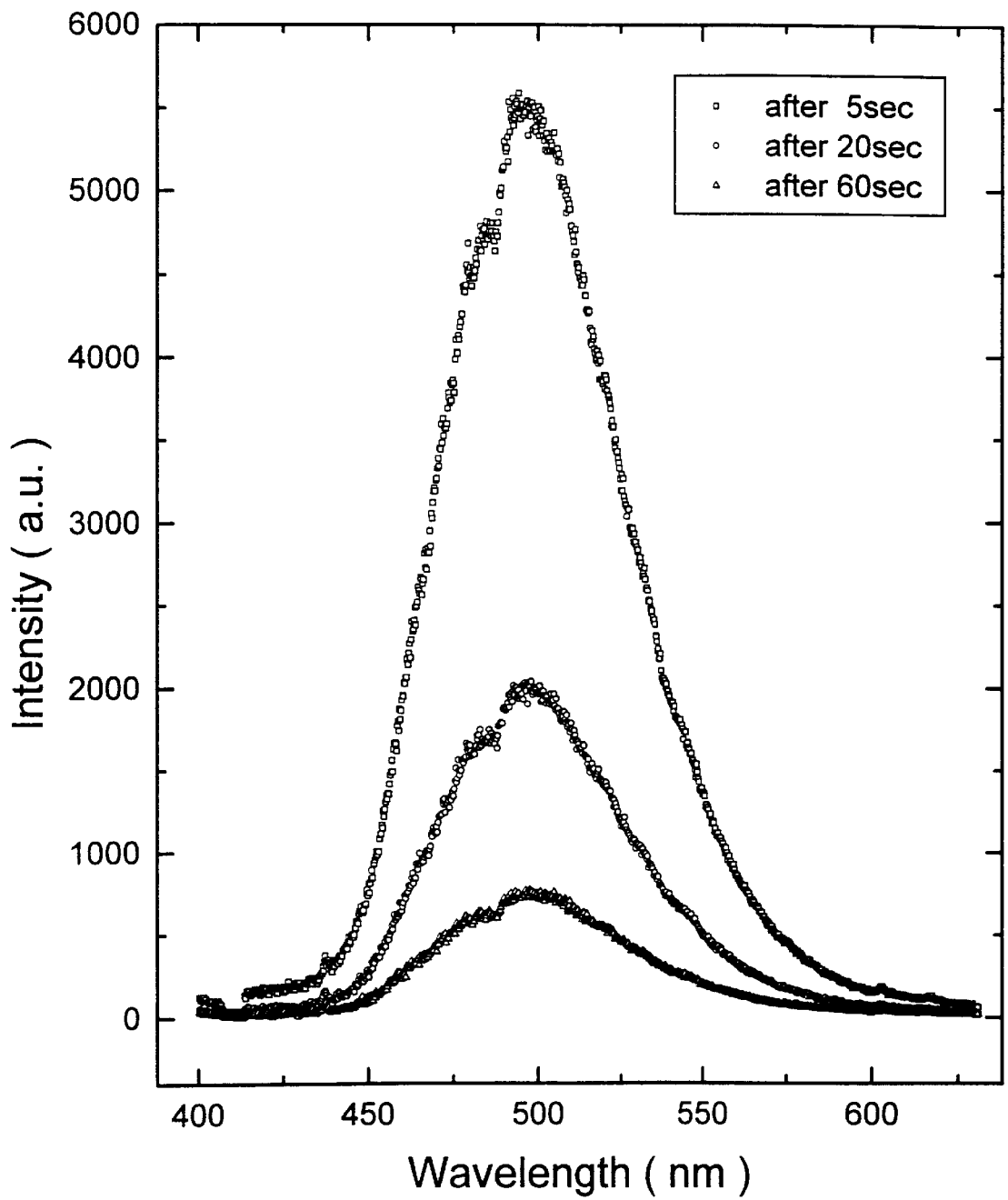
FIG. 16 illustrates the spectra of the after-glow of $Sr_{0.49}Ca_{0.49}Al_4O_7$:0.01Eu, 0.02Pr after exposure to a 4 W UV lamp for 2 minutes as a function of time after illumination (□, after 5 sec.; ○, after 20 sec. and Δ, after 60 sec.).

FIG. 16 is the luminescence spectra of the $(Sr_{0.485}Ca_{0.485})$ $(0.1B_2O_3)Al_4O_7$: 0.01Eu:0.02Pr sample. No obvious spectral shift compared to the Sr phosphor was observed.

Phosphors containing Sr, Ca and Ba can also be prepared by combining the components in the following molar proportions:

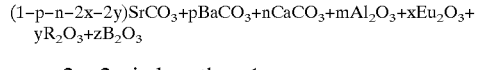

where p+n+2x+2y is less than 1, y ranges from about 0.0001 to about 0.010 and preferably the value of y=the value of x z ranges from about 0.02 to about 0.2; and $R^{3+}$ is a trivalent rare earth ion or $Bi^{3+}$.

These mixed alkaline earth aluminates have the formula:

$$Sr_kBa_pCa_nO \cdot mAl_2O_3(zB_2O_3):2xEu,2yR, \qquad 9$$

where k=1−n−p−2x−2y.

Example 12

Codoping of $Mg^{2+}$ or $Zn^{2+}$ into $MO \cdot mAl_2O_3:Eu^{2+},R^{3+}$ phosphors In phosphor materials of this invention, $Al^{3+}$, in the alkaline earth aluminate can be replaced with divalent ions, such as $Mg^{2+}$ or $Zn^{3+}$. Phosphor components are combined according to the molar proportions in the following general recipe:

$$(1-2x-2y)MCO_3+(m-q)Al_2O_3+xEu_2O_3+yR_2O_3+qXO+zB_2O_3$$

where: 2x+2y is less than 1;

q is less than m and preferably ranges from 0.002 to 0.2; the ranges for x, y, m and z are as given in formula 1. XO, in particular, can be MgO and/or ZnO. These phosphors will have the generic formula:

$$M_kO \cdot (m-q)Al_2O_3 \cdot qXO:2xEu,2yR, \qquad 10$$

where k=1−2x−2y where the ranges for m, x and y are as above.

Exemplary Mg or Zn doped phosphors are prepared by combining the components according to the following molar proportions:

$$0.98\ SrCO_3+1.99\ Al_2O_3+0.01\ XO+0.005\ Eu_2O_3+0.005\ Dy_2O_3+0.1\ B_2O_3$$

where XO can be MgO or ZnO.

Table 5 provides measurements of relative after-glow intensity at 488 nm of strontium aluminate ($SrAl_4O_7$) phosphors in which $Mg^{2+}$ or $Zn^{2+}$ replaces $Al^{3+}$.

TABLE 5

The influence of substituting MgO or ZnO for $Al^{3+}$ on the after-glow of $SrAl_4O_7(0.1B_2O_3):0.01Eu,0.01Pr$

| after (min) | SAO-EuPr[1] | SAO-EuPrMg | SAO-EuPrZn |
|---|---|---|---|
| 10 | 100 | 104 | 104 |
| 30 | 31 | 33 | 33 |
| 60 | 15 | 16 | 16 |

[1]Data is referenced to that of SAO-EuPr.

Example 13

Co-doping of $Na^+$ or $K^+$ into $MO \cdot mAl_2O_3:Eu^{2+}, R^{3+}$ phosphors

In phosphor materials of this invention, $M^{2+}$, in the alkaline earth aluminate can be replaced with monovalent ions, such as $Na^+$ or $K^+$. Phosphor components are combined according to the molar proportions in the following general recipe:

$$(1-2x-2y-2r)MCO_3+mAl_2O_3+xEu_2O_3+yR_2O_3+rZ_2CO_3+zB_2O_3$$

where: 2x+2y+2r is less than 1;

r preferably ranges from 0.002 to 0.2; and the ranges for x, y, m and z are as given in formula 1.

$Z_2CO_3$, in particular, can be $Na_2CO_3$ and/or $K_2CO_3$. These phosphors will have the generic formula:

$$M_kO \cdot mAl_2O_3 \cdot rNa_2O:2xEu,2yR, \qquad 11$$

where k=1−2r−2x−2y and where the ranges for r, m, x and y are as above,

Exemplary Na and K doped phosphors are prepared by combining the components according to the following molar proportions:

$$0.97\ SrCO_3+2\ Al_2O_3+0.005\ Eu_2O_3+0.005\ Dy_2O_3+0.005\ X_2CO_3+0.1\ B_2O_3$$

where $Z_2CO_3$ can be $Na_2CO_3$ or $K_2CO_3$.

Table 6 provides measurements of relative after-glow intensity at 488 nm of strontium aluminate ($SrAl_4O_7$) phosphors in which $Na^+$ or $K^+$ replaces $Sr^{2+}$.

TABLE 6

The influence of substituting $Na^+$ or $K^+$ for $Sr^{3+}$ on the after-glow of $SrAl_4O_7(0.1B_2O_3):0.01Eu,0.01Pr$

| after (min) | SAO-EuPr[1] | SAO-EuPrNa | SAO-EuPrK |
|---|---|---|---|
| 10 | 100 | 112 | 135 |
| 30 | 31 | 34 | 42 |
| 60 | 15 | 17 | 20 |

[1]Data is referenced to that of SAO-EuPr.

Example 14

Preparation and Characterization of Alkaline earth aluminate phosphors of varying ratio of Al/M A series of strontium aluminate phosphors activated with $Eu^{2+}$ and doped with $Pr^{3+}$ were prepared having different ratios of Al/Sr. Phosphor components were mixed according to the molar proportions:

$$0.98\ SrCO_3+mAl_2O_3+0.005\ Eu_2O_3+0.005\ Pr_2O_3+0.1B_2O_3$$

with m=1.6, 1.75. 1.85, 1.95, 2.0, and 2.15 and phosphors prepared according to the general procedure of Example 1.

Table 7 provides measurements of relative after-glow intensity at 488 nm of strontium aluminates as indicated. All of the samples tested have acceptable brightness and persistence. The sample where m=1.75 corresponding to $Sr_4Al_{14}O_{25}$ exhibits somewhat brighter phosphorescence.

TABLE 7

The influence of varying Al/Sr ratio on after-glow of $SrO \cdot mAl_2O_3(0.1B_2O_3):0.01Eu,0.01Pr$

| | m = | | | | | |
|---|---|---|---|---|---|---|
| After/min. | 1.6 | 1.75 | 1.85 | 1.95 | 2.0[1] | 2.15 |
| 10 | 113 | 121 | 106 | 100 | 100 | 88 |
| 30 | 37 | 37 | 32 | 31 | 30 | 28 |
| 60 | 17 | 16 | 15 | 14 | 14 | 12 |

[1]Data is referenced to that at m = 2.

Example 15

Effect of variation of the amount of flux on phosphor properties

A series of strontium aluminate phosphors ($SrAl_4O_7$) activated with $Eu^{2+}$ and doped with $Pr^{3+}$ were prepared using varying amounts of flux ($zB_2O_3$). Phosphor components were mixed according to the molar proportions:

$$0.98\ SrCO_3 + mAl_2O_3 + 0.005\ Eu_2O_3 + 0.005\ Pr_2O_3 + zB_2O_3$$

with z=0.03, 0.05, 0.08, 0.10, 0.12, 0.15. and 0.20 and phosphors were prepared according to the general procedure of Example 1.

Table 8 provides measurements of relative after-glow intensity at 488 nm of strontium aluminates as indicated. The samples where z=0.03 to 0.20 have acceptable brightness and persistence. The sample where z=0.12 was brighter than other samples tested.

Example 16

General Methods of Preparation of Blue Phosphors with Host Material $M_4Al_{14}O_{25}$ (where M is Sr or a mixture of Sr with Ba and/or Ca)

Phosphor components are mixed according to the molar proportions in the following general recipe:

$$(4-8x-8y)\ MCO_3 + 7.00\ Al_2O_3 + 4xEu_2O_3 + 4yR_2O_3 + 4zB_2O_3$$

where:

8x+8y is less than 4, x is preferably about 0.0001 to about 0.05 and more preferably x is 0.001 to about 0.005;

y ranges from about 0.0001 to about 0.010 and preferably the value of y=the value of x z ranges from about 0.02 to about 0. 1;

M is Sr or a combination of Sr with Ca and/or Ba; and

R is a trivalent rare earth ion or $Bi^{3+}$.

$B_2O_3$ is used as a flux in the composition and is important for ensuring the formation of the phosphorescent phase.

TABLE 8

The influence of varying $B_2O_3$ in preparation of phosphors

| After/min. | z = 0.03 | 0.05 | 0.08 | 0.10[1] | 0.12 | 0.15 | 0.20 |
|---|---|---|---|---|---|---|---|
| 10 | 113 | 121 | 106 | 100 | 132 | 100 | 99 |
| 30 | 37 | 37 | 32 | 31 | 41 | 32 | 30 |
| 60 | 17 | 16 | 15 | 14 | 17 | 15 | 14 |

[1]Data is referenced to that at n = 0.10

Example 17

Single Crystal Blue Phosphors

Single crystals of the alkaline earth aluminate phosphors of this invention can be grown directly from a melt by well-known techniques. For example, the conventional Czochralski method (J. Czochralski (1918) Z. Phys. Chem. 92:219), the floating zone method (W. G. Pfann (1952) Trans. AIME 194:747) or the laser heated pedestal method (B. M. Tissue et al. (1991) J. Crystal Growth 109:323) can be used. The following procedure employs the laser heated pedestal method:

The phosphor components are mixed in the appropriate molar proportions according to the preparative examples hereinabove and the mixtures are milled or ground to give a homogeneous fine powder. The powder is pressed into pellets under about 1.3 ton/cm² pressure. The pressed pellets are then prefired in air at about 600° C. for about one hour. The prefired pellets are pulverized and milled again into a fine powder. The prefired powder is pressed again into ceramic pellets at the same pressure. The pellets are then sintered at about 1,300° C. for one hour in a flowing $H_2$—$N_2$ gas mixture (2%–5% by volume $H_2$) with a flow rate of about 0.1 liter/min. Eu in the material is reduced to the divalent state, while the other metallic ions remain in the original valence state. The sintered pellets are cut into bars with cross-sections of about 1×1 mm. The bars are carefully cleaned with solvents (such as alcohol or acetone) before introduction into the growth chamber. The growth chamber is filled with inert gas (or a mixture of inert gas and <1% $H_2$, e.g., 99.99% $N_2$). Care must be taken to prevent re-oxidation of the europium ions from the 2+ state to the 3+ state and to prevent reduction to the monovalent state or metal at the melting temperature. Other metals present in the material should remain in their original valence state.

Single crystal growth proceeds substantially as described in Yen et al. (1995) "Preparation of single crystal fibers," in *Insulating Materials for Optoelectronics*, ed. Agullo-Lopez (World Scientific, Singapore) Chapter 2.

Those of ordinary skill in the art will appreciate that the phosphors of this invention can be prepared using starting materials other than those specifically disclosed herein and that procedures and techniques functionally equivalent to those described herein can be employed to make and assess the phosphors herein. Those of ordinary skill in the art will also appreciate that the host matrix of this invention may accommodate metal ions other than those specifically mentioned herein without significant effect upon phosphor properties.

All references cited herein are incorporated by reference herein to the extent that they are not inconsistent herewith.

We claim:

1. A phosphor represented by the formula:

$$MO \cdot mAl_2O_3 : Eu^{2+}, R^{3+}$$

wherein m is a number ranging from about 1.6 to about 2.2, M is Sr or a combination of Sr with Ca, Ba or both, $R^{3+}$ is a trivalent metal ion or a mixture thereof, $Eu^{2+}$ is present at a level from about 0.02 mol % to about 10 mol % of M, and $R^{3+}$ is present at a level from about 0.02mol % to about 20 mol % of M.

2. The phosphor of claim 1 wherein $R^{3+}$ is selected from the group $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, $Yb^{3+}$ and $Bi^{3+}$.

3. The phosphor of claim 1 wherein $R^{3+}$ is $Pr^{3+}$, $Ho^{3+}$, $Dy^{3+}$, $Nd^{3+}$ or mixtures thereof.

4. The phosphor of claim 1 which is a single crystal.

5. The phosphor of claim 1 which has the formula:

$$SrAl_4O_7 : 2xEu^{2+}, 2yR^{3+}$$

wherein x can range from about 0.0001 to about 0.05, and y can range from about 0.0001 to about 0.10.

6. The phosphor of claim 5 wherein $R^{3+}$, is $Pr^{3+}$, $Ho^{3+}$, a combination of $Pr^{3+}$ with $Dy^{3+}$, or a combination of $Ho^{3+}$ with $Dy^{3+}$.

7. The phosphor of claim 5 wherein x is a number ranging from about 0.0001 to about 0.005.

8. The phosphor of claim 1 wherein m is 2 or 1.75.

9. The phosphor of claim 8 wherein M is Sr.

10. A phosphor represented by the formula:

$$MO \cdot mAl_2O_3 : Eu^{2+}, R^{3+}$$

wherein m is a number ranging from about 1.6 to about 2.2, M is Sr or a combination of Sr with Ca, Ba or both, $R^{3+}$ is a mixture of $Y^{3+}$ with another trivalent metal ion, $Eu^{2+}$ is present at a level from about 0.02 mol % to about 10 mol % of M, and $R^{3+}$, is present at a level from about 0.02 mol % to about 20 mol % of M.

11. The phosphor of claim 10 wherein $R^{3+}$ is a mixture of $Y^{3+}$ with a trivalent metal ion selected from the group $Pr^{3+}$, $Ho^{3+}$, $Nd^{3+}$, $Dy^{3+}$, $Er^{3+}$, $La^{3+}$, $Lu^{3+}$, $Ce^{3+}$, $Sm^{3+}$, $Gd^{3+}$, $Tb^{3+}$, $Tm^{3+}$, $Yb^{3+}$ and $Bi^{3+}$.

12. A phosphor having the formula:

$$Sr_kBa_pCa_nO \cdot mAl_2O_3:2xEu^{2+},2yR^{3+}$$

where k=1−n−p−2x−2y and k is greater than 0, and n and p are numbers greater than or equal to 0 and less than 1, x is a number that can range from about 0.0001 to about 0.05 and v is a number that can range from 0.0001 to about 0.10.

13. A method for making a single crystal phosphor which comprises the steps of:

(a) combining the phosphor components according to the stoichiometry of the formula:

$$MO \cdot mAl_2O_3:Eu^{2+},R^{3+}$$

wherein m is a number ranging from about 1.6 to about 2.2, M is Sr or a combination of Sr with Ca, Ba or both, $R^{3+}$ is a trivalent metal ion or a mixture thereof, $Eu^{2+}$ is present at a level from about 0.02mol % to about 10 mol % of M, and $R^{3+}$ is present at a level from about 0.02 mol % to about 20 mol % of M to form a powder;

(b) sintering the powder in a reducing atmosphere;

(c) growing single crystals from the sintered powder under an inert atmosphere.

14. The method of claim 13 wherein a flux is combined with phosphor components in step (a).

15. A phosphor represented by the formula:

$$MO \cdot mAl_2O_3:Eu^{2+},R^{3+}$$

wherein m is a number ranging from about 1.6 to about 2.2, M is Sr or a combination of Sr with Ca, Ba or both, $R^{3+}$ is a trivalent rare earth metal ion, $Bi^{3+}$ or mixtures thereof, $Eu^{2+}$ is present at a level from about 0.02 mol % to about 10 mol % of M, and $R^{3+}$ is present at a level from about 0.02 mol % to about 20 mol % of M in which a portion of the $Al^{3+}$ in the host is substituted by a divalent metal ion or in which a portion of the $M^2$ in the phosphor is substituted by a monovalent metal ion.

16. A phosphor of claim 15 wherein a portion of the $Al^{3+}$ in the host is substituted by a divalent metal ion.

17. The phosphor of claim 16 wherein the divalent ion is $Mg^{2+}$ or $Zn^{2+}$ or a mixture thereof.

18. The phosphor of claim 16 in which $M^{2+}$ in the phosphor is substituted by a monovalent metal ion.

19. The phosphor of claim 16 in which the amount of divalent metal ion substituted into the phosphor is equal to the amount of $R^{3+}$ in the phosphor.

20. The phosphor of claim 16 in which the amount of divalent metal ion substituted into the phosphor ranges from about 0.02 mol % to about 20 mol %.

21. The phosphor of claim 15 in which a portion of the $M^{2+}$ in the phosphor is substituted by a monovalent metal ion.

22. The phosphor of claim 21 in which the monovalent metal ion is $Na^+$ or $K^+$.

23. The phosphor of claim 22 in which the monovalent metal ion is present in the phosphor in an amount about equal to the amount of $R^{3+}$ trivalent metal ion doped into the phosphor.

24. The phosphor of claim 21 in which the amount of divalent metal ion substituted into the phosphor ranges from about 0.02 mol % to about 20 mol %.

25. The phosphor of claim 15 wherein $R^{3+}$ is selected from the group $Pr^{3+}$, $Ho^{3+}$, $Nd^{3+}$, $Dy^{3+}$, $Er^{3+}$, $La^{3+}$, $Lu^{3+}$, $Ce^{3+}$, $Y^{3+}$, $Sm^{3+}$, $Gd^{3+}$, $Tb^{3+}$, $Tm^{3+}$, $Yb^{3+}$ and $Bi^{3+}$.

26. The phosphor of claim 15 wherein $R^{3+}$ is $Pr^{3+}$, $Ho^{3+}$, $Dy^{3+}$, or $Nd^{3+}$ or mixtures thereof.

27. The phosphor of claim 15 wherein $R^{3+}$ is a mixture of $Y^{3+}$ with another trivalent metal ion.

28. The phosphor of claim 15 which is a single crystal.

29. The phosphor of claim 15 further comprising from about 2 mol % to about 20 mol % of $B_2O_3$.

30. The phosphor of claim 15 wherein M is Sr.

* * * * *

UNITED STATES PATENT AND TRADEMARK OFFICE
CERTIFICATE OF CORRECTION

PATENT NO.     : 6,117,362
DATED          : September 12, 2000
INVENTOR(S)    : Yen et al.

It is certified that error appears in the above-identified patent and that said Letters Patent is hereby corrected as shown below:

Title page,
Item [57], ABSTRACT
Delete "$MO.mAl_2O_3:Eu^{2+},R^{3+}$" and replace with -- $MO \cdot mAl_2O_3:Eu^{2+},R^{3+}$ --.

Column 1,
Line 28, delete "$SrAl_2O_4:Eu^{2+}:Dy^{3+}$" and replace with -- $SrAl_2O_4:Eu^{2+},Dy^{3+}$ --.
Lines 37-38, delete "has obtained" and replace with -- has been obtained --.
Line 41, delete "$Sr^{+2}$" and replace with -- $Sr^{2+}$ --.
Line 50, delete "$Dy^{+3}$" and replace with -- $Dy^{3+}$ --.
Line 50, delete "$Eu^{+2}$" and replace with -- $Eu^{2+}$ --.
Line 62, delete "$M_{1-x}Al_2O_{4-x}$ Where" and replace with -- $M_{1-x}Al_2O_{4-x}$, where --.

Column 2,
Line 16, delete the comma after "$Eu^{2+}$".
Lines 22-23, delete "$2SrO.3Al_2O_3:Eu^{2+}$" and replace with -- $2SrO \cdot 3Al_2O_3:Eu^{2+}$ --.
Lines 25-26, delete "$4SrO.7Al_2O_3:Eu^{2+}$" and replace with -- $4SrO \cdot 7Al_2O_3:Eu^{2+}$ --.
Line 26, delete "$BaO.4Al_2O_3:Eu^{2+}$" and replace with -- $BaO \cdot 4Al_2O_3:Eu^{2+}$ --.
Line 38, delete "$MO.mAl_2O_3:Eu^{2+},R^{3+}$" and replace with -- $MO \cdot mAl_2O_3:Eu^{2+},R^{3+}$ --.
Line 47, delete "$MO.mAl_2O_3(zB_2O_3):Eu^{2+},R^{3+}$" and replace with -- $MO \cdot mAl_2O_3(zB_2O_3):Eu^{2+},R^{3+}$ --.

Column 4,
Line 32, delete "$Sr_{0.64}Ba_{0.33}Al_4O_7$" and replace with -- $Sr_{0.33}Ba_{0.64}Al_4O_7$ --.
Line 36, delete "$Sr_{0.49}Ca_{0.49}Al_4O_7$" and replace with -- $Sr_{0.485}Ca_{0.485}Al_4O_7$ --.

Column 5,
Line 9, delete "pressure" and replace with -- pressures --.
Line 13, delete "disntinguishable" and replace with -- distinguishable --.
Line 16, delete "one the order" and replace with -- on the order --.
Line 38, delete "lasting form" and replace with -- lasting from --.
Line 46, delete "can exhibt" and replace with -- can exhibit --.
Line 49, delete "exhibt" and replace with -- exhibit --.
Line 55, delete "$MO.mAl_2O_3$" and replace with -- $MO \cdot mAl_2O_3$ --.

UNITED STATES PATENT AND TRADEMARK OFFICE
CERTIFICATE OF CORRECTION

PATENT NO. : 6,117,362
DATED : September 12, 2000
INVENTOR(S) : Yen et al.

It is certified that error appears in the above-identified patent and that said Letters Patent is hereby corrected as shown below:

Column 7,
Line 10, delete "pellets are the" and replace with -- pellets are then --.
Line 15, delete "laser heated pedestal method" and replace with -- laser heated pedestal growth (LHPG) method --.
Line 16, delete "bars to" and replace with -- bars for --.
Line 20, delete "somehat" and replace with -- somewhat --.
Line 28, delete "LHGP" and replace with -- LHPG --.
Line 42, delete "$M_kO.mAl_2O_3(zB_2O_3):2xEu^{2+},2yR^{3+}$" and replace with -- $M_kO \cdot mAl_2O_3 (zB_2O_3):2xEu^{2+},2yR^{3+}$ --.

Column 8,
Line 1, delete "$M_kO.mAl_2O_3(zB_2O_3):2xEu^{2+},2y_1R_1^{3+},2y_2R_2^{3+}$" and replace with -- $M_kO \cdot mAl_2O_3(zB_2O_3):2xEu^{2+},2y_1R_1^{3+},2y_2R_2^{3+}$ --.
Line 15, delete "$M_kO.(m-q)Al_2O_3.qXO(zB_2O_3):2xEu^{2+},2yR^{3+}$" and replace with -- $M_kO \cdot (m-q)Al_2O_3 \cdot qXO(zB_2O_3):2xEu^{2+},2yR^{3+}$ --.
Line 31, delete "$M_kO.mAl_2O_3.rZ_2(zB_2O_3):2xEu^{2+},2yR^{3+}$" and replace with -- $M_kO \cdot mAl_2O_3 \cdot rZ_2(zB_2O_3):2xEu^{2+},2yR^{3+}$ --.
Line 60, delete "$MO.mAl_2O_3$" and replace with -- $MO \cdot mAl_2O_3$ --.

Column 9,
Line 10, delete "$M_kO.mAl_2O_3(zB_2O_3):2xEu^{2+},2yR^{3+}$" and replace with -- $M_kO \cdot mAl_2O_3 (zB_2O_3):2xEu^{2+},2yR^{3+}$ --.
Line 28, delete "$M_kO.mAl_2O_3(zB_2O_3):2xEu^{2+},2y_1R_1^{3+}, 2y_2R_2^{3+}$" and replace with -- $M_kO \cdot mAl_2O_3(zB_2O_3):2xEu^{2+},2y_1R_1^{3+}, 2y_2R_2^{3+}$ --.
Line 50, delete "$M_kO.(m-q)Al_2O_3.qXO(zB_2O_3):2xEu^{2+},2yR^{3+}$" and replace with -- $M_kO \cdot (m-q)Al_2O_3 \cdot qXO(zB_2O_3):2xEu^{2+},2yR^{3+}$ --.
Line 67, delete "$M_kO.mAl_2O_3.rZ_2(zB_2O_3):2xEu^{2+},2yR^{3+}$" and replace with -- $M_kO \cdot mAl_2O_3 \cdot rZ_2(zB_2O_3):2xEu^{2+},2yR^{3+}$ --.

Column 10,
Line 2, delete "x ranges" and replace with -- x is a number ranging --.
Line 4, delete "z ranges" and replace with -- z is a number ranging --.
Line 4, after "about 0.2;" insert on a new line -- m is a number ranging from about 1.6 to about 2.2; --.
Line 5, start a new line after "$K^+$".
Line 7, after "E has" insert -- the value of --.
Line 11, delete "$Sr_kBa_pCa_nO.mAl_2O_3(zB_2O_3):2xEu^{2+},2yR^{3+}$" and replace with -- $Sr_kBa_pCa_nO \cdot mAl_2O_3(zB_2O_3):2xEu^{2+},2yR^{3+}$ --.
Line 45, delete "$Bi^{2+}$" and replace with -- $Bi^{3+}$ --.

UNITED STATES PATENT AND TRADEMARK OFFICE
CERTIFICATE OF CORRECTION

PATENT NO. : 6,117,362
DATED : September 12, 2000
INVENTOR(S) : Yen et al.

It is certified that error appears in the above-identified patent and that said Letters Patent is hereby corrected as shown below:

Column 11,
Lines 6 and 16, delete "$SrAl_4O_7:0.01Eu^{2+}:0.02Pr^{3+}$" and replace with
-- $SrAl_4O_7(0.1B_2O_3):0.01Eu^{2+},0.02Pr^{3+}$ --.
Line 25, delete "$SrAl_4O_7(0.1B_2O_3):0.01Eu^{2+}:0.02Pr^{3+}$" and replace with
-- $SrAl_4O_7(0.1B_2O_3):0.01Eu^{2+},0.02Pr^{3+}$ --.
Lines 29, 32, 37 and 39-40, delete "$SrAl_4O_7(0.1B_2O_3):0.01Eu^{2+}:0.02Pr^{3+}$" and replace
with -- $SrAl_4O_7(0.1B_2O_3):0.01Eu^{2+},0.02Pr^{3+}$ --.
Line 46, delete "$SrAl_4O_7(B_2O_3):Eu^{2+}:Pr^{3+}$" and replace with -- $SrAl_4O_7(B_2O_3):Eu^{2+},Pr^{3+}$ --.
Lines 50-51, delete "$SrAl_4O_7(0.1B_2O_3):Eu^{2+}:Pr^{3+}$" and replace with -- $SrAl_4O_7(0.1B_2O_3):Eu^{2+},Pr^{3+}$ --.
Line 60, delete "0.01 to 0.15" and replace with -- 0.001 to 0.015 --.

Column 12,
Lines 17-18 and 21-22, delete "$SrAl_4O_7(0.1B_2O_3):Eu^{2+}:Pr^{3+}$" and replace with -- $SrAl_4O_7(0.1B_2O_3):Eu^{2+},Pr^{3+}$ --.
Line 43, Table 2, delete "$SrAl_4O_7(B_2O_3):0.01Eu:2yPr$" and replace with -- $SrAl_4O_7(B_2O_3):0.01Eu,2yPr$ --.
Lines 55-56, delete "$SrAl_4O_7(B_2O_3):Eu^{2+}:Ho^{3+}$" and replace with -- $SrAl_4O_7(B_2O_3):Eu^{2+},Ho^{3+}$ --.
Lines 58 and 66, delete "$SrAl_4O_7(0.1B_2O_3):0.01Eu^{2+}:0.02Ho^{3+}$" and replace with -- $SrAl_4O_7(0.1B_2O_3):0.01Eu^{2+},0.02Ho^{3+}$ --.

Column 13,
Lines 8, 14, 17 and 22, delete "$SrAl_4O_7(0.1B_2O_3):0.01Eu^{2+}:0.02Ho^{3+}$" and replace
with -- $SrAl_4O_7(0.1B_2O_3):0.01Eu^{2+},0.02Ho^{3+}$ --.
Lines 29-30, delete "$SrAl_4O_7(B_2O_3):Eu^{2+}:Nd^{3+}$" and replace with -- $SrAl_4O_7(B_2O_3):Eu^{2+},Nd^{3+}$ --.
Lines 33, 43, 53, 58, 61 and 66, delete "$SrAl_4O_7(0.1B_2O_3):0.01Eu^{2+}:0.02Nd^{3+}$" and
replace with -- $SrAl_4O_7(0.1B_2O_3):0.01Eu^{2+},0.02Nd^{3+}$ --.
Line 54, delete "line (a)" and replace with -- (line a) --.

UNITED STATES PATENT AND TRADEMARK OFFICE
CERTIFICATE OF CORRECTION

PATENT NO.     : 6,117,362
DATED          : September 12, 2000
INVENTOR(S)    : Yen et al.

It is certified that error appears in the above-identified patent and that said Letters Patent is hereby corrected as shown below:

Column 14,
Lines 7 and 15, delete "$SrAl_4O_7(0.1B_2O_4):0.01Eu^{2+}:0.02R^{3+}$" and replace with -- $SrAl_4O_7(0.1B_2O_4):0.01Eu^{2+},0.02R^{3+}$ --.
Line 19, after "(+)" please insert -- are shown --.
Lines 34-35, delete "$SrAl_4O_7(B_2O_3):0.01Eu^{2+}:0.01Pr^{3+}:0.01R^{3+}$" and replace with -- $SrAl_4O_7(B_2O_3):0.01Eu^{2+},0.01Pr^{3+},0.01R^{3+}$ --.
Line 38, delete "$SrAl_4O_7(B_2O_3):Eu^{2+}:Pr^{3+}$" and replace with -- $SrAl_4O_7(B_2O_3):Eu^{2+}, Pr^{3+}$ --.
Line 48, delete "ranges of in" and replace with -- ranges of m --.
Lines 56 and 60-61, delete "$SrAl_4O_7(0.1B_2O_3):0.01Eu:0.01Pr:0.01R$" and replace with -- $SrAl_4O_7(0.1B_2O_3):0.01Eu,0.01Pr,0.01R$ --.

Column 16,
Line 13, delete "$(Sr_{0.33} Ba_{0.64})(0.1B_2O_3)Al_4O_7:0.01Eu:0.02Pr$" and replace with -- $(Sr_{0.33} Ba_{0.64})(0.1B_2O_3)Al_4O_7:0.01Eu,0.02Pr$ --.
Line 22, delete "$Sr_kBa_pO \cdot mAl_2O_3(zB_2O_3):2xEu,2yR$" and replace with -- $Sr_kBa_pO \cdot mAl_2O_3(zB_2O_3):2xEu,2yR$ --
Line 48, delete "$Sr_kCa_nO.mAl_2O_3(zB_2O_3):2xEu,2yR$" and replace with -- $Sr_kCa_nO \cdot mAl_2O_3(zB_2O_3):2xEu,2yR$ --
Line 52, delete "$(Sr_{0.485} Ca_{0.485})Al_4O_7:0.01Eu:0.02Pr$" and replace with -- $(Sr_{0.485} Ca_{0.485})Al_4O_7:0.01Eu,0.02Pr$ --.
Lines 58-59, delete "$(Sr_{0.485} Ca_{0.485})(0.1B_2O_3)Al_4O_7:0.01Eu:0.02Pr$" and replace with -- $(Sr_{0.485} Ca_{0.485})(0.1B_2O_3)Al_4O_7:0.01Eu,0.02Pr$ --.

Column 17,
Line 7, delete "$Sr_kBa_pCa_nO.mAl_2O_3(zB_2O_3):2xEu,2yR$" and replace with -- $Sr_kBa_pCa_nO \cdot mAl_2O_3(zB_2O_3):2xEu,2yR$ --.
Lines 13-14 and 57-58, delete "$MO.mAl_2O_3:Eu^{2+},R^{3+}$" and replace -- $MO \cdot mAl_2O_3:Eu^{2+}, R^{3+}$ --.
Line 29, delete "$M_kO.(m-q)Al_2O_3.qXO:2xEu,2yR$" and replace with -- $M_kO \cdot (m-q)Al_2O_3 \cdot qXO:2xEu,2yR$ --.

Column 18,
Line 6, delete "$M_kO.mAl_2O_3.rNa_2O:2xEu,2yR$" and replace with -- $M_kO \cdot mAl_2O_3 \cdot rNa_2O:2xEu,2yR$ --.

UNITED STATES PATENT AND TRADEMARK OFFICE
CERTIFICATE OF CORRECTION

PATENT NO.    : 6,117,362
DATED         : September 12, 2000
INVENTOR(S)   : Yen et al.

It is certified that error appears in the above-identified patent and that said Letters Patent is hereby corrected as shown below:

Column 20,
Line 7, start a new paragraph after "original valence state.".
Line 36, delete "$MO.mAl_2O_3:Eu^{2++},R^{3+}$" and replace with -- $MO·mAl_2O_3:Eu^{2+},R^{3+}$ --.
Lines 44-45, delete "selected from the group".
Line 46, delete "and" and replace with -- or --.
Line 64, delete "$MO.mAl_2O_3:Eu^{2+},R^{3+}$" and replace with -- $MO·mAl_2O_3:Eu^{2+},R^{3+}$ --.

Column 21,
Line 3, delete "$R^{3+}$, is present" and replace with -- $R^{3+}$ is present --.
Line 11, delete "$Sr_kBa_pCa_nO.mAl_2O_3:2xEu^{2+},2yR^{3+}$ " and replace with
-- $Sr_kBa_pCa_nO·mAl_2O_3:2xEu^{2+},2yR^{3+}$ --.
Line 15, delete "v" and replace with -- y --.
Lines 22 and 37, delete "$MO.mAl_2O_3:Eu^{2+},R^{3+}$" and replace with -- $MO·mAl_2O_3:Eu^{2+},R^{3+}$ --.

Column 22,
Line 4, delete "$M^2$" and replace with -- $M^{2+}$ --.
Line 10, after "in which" insert -- a portion of the --.

Signed and Sealed this

Fifteenth Day of April, 2003

JAMES E. ROGAN
*Director of the United States Patent and Trademark Office*